United States Patent
Kaneko et al.

(10) Patent No.: US 11,031,213 B2
(45) Date of Patent: Jun. 8, 2021

(54) MICROWAVE OUTPUT DEVICE AND PLASMA PROCESSING DEVICE

(71) Applicant: Tokyo Electron Limited, Tokyo (JP)

(72) Inventors: Kazushi Kaneko, Miyagi (JP); Yuji Onuma, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 96 days.

(21) Appl. No.: 16/491,012

(22) PCT Filed: May 2, 2018

(86) PCT No.: PCT/JP2018/017543
§ 371 (c)(1),
(2) Date: Sep. 4, 2019

(87) PCT Pub. No.: WO2018/207705
PCT Pub. Date: Nov. 15, 2018

(65) Prior Publication Data
US 2020/0013587 A1   Jan. 9, 2020

(30) Foreign Application Priority Data
May 10, 2017  (JP) .............................. JP2017-094135

(51) Int. Cl.
*H01J 37/32*  (2006.01)
*H01L 21/66*  (2006.01)

(52) U.S. Cl.
CPC ... *H01J 37/32266* (2013.01); *H01J 37/32211* (2013.01); *H01J 37/32302* (2013.01); *H01J 37/32935* (2013.01); *H01L 22/26* (2013.01)

(58) Field of Classification Search
CPC ......... H01J 37/32211; H01J 37/32266; H01J 37/32302; H01J 37/32935; H01L 22/26
See application file for complete search history.

(56) References Cited

U.S. PATENT DOCUMENTS 5,472,561 A * 12/1995 Williams .............. B24B 37/013
216/61
6,562,079 B1 * 5/2003 Takamatsu ............ C23C 16/511
118/723 MR (Continued)

FOREIGN PATENT DOCUMENTS

JP      2012-109080 A    6/2012
JP      2014-154421 A    8/2014

OTHER PUBLICATIONS

International Search Report issued in PCT/JP2018/017543; dated Jul. 24, 2018.

Primary Examiner — Kurtis R Bahr
(74) Attorney, Agent, or Firm — Studebaker & Brackett PC

(57) ABSTRACT

A device includes a microwave generation unit that averages the first measured values and the second measured values at a predetermined movement average time and a predetermined sampling interval, and controls the microwave such that a value obtained by subtracting the averaged second measured value from the averaged first measured value comes close to the setting power, and in which the predetermined movement average time is 60 µs or less, and a relationship of $y \geq 78.178 x^{0.1775}$ is satisfied when the predetermined sampling interval is indicated by x, and the predetermined movement average time is indicated by y.

12 Claims, 17 Drawing Sheets

(56) References Cited

U.S. PATENT DOCUMENTS

| | | | |
|---|---|---|---|
| 2007/0152678 A1* | 7/2007 | Matoba | H01J 37/321 324/601 |
| 2011/0192349 A1* | 8/2011 | Hammond, IV | H01J 37/32091 118/723 E |
| 2012/0249165 A1* | 10/2012 | Mcerlean | A61B 18/1815 324/642 |
| 2015/0022086 A1* | 1/2015 | Kaneko | H01J 37/32183 315/111.21 |
| 2015/0108897 A1* | 4/2015 | Kaneko | H01J 37/32935 315/111.21 |
| 2016/0295675 A1* | 10/2016 | Yuzurihara | H01J 37/32082 |
| 2019/0057844 A1* | 2/2019 | Kaneko | H01J 37/32146 |
| 2019/0244789 A1* | 8/2019 | Kaneko | G01R 23/16 |
| 2019/0267216 A1* | 8/2019 | Kaneko | H01J 37/32311 |

* cited by examiner

MICROWAVE OUTPUT DEVICE AND PLASMA PROCESSING DEVICE

TECHNICAL FIELD

Embodiments of the present disclosure relate to a microwave output device and a plasma processing device.

BACKGROUND ART

A plasma processing device is used to manufacture an electronic device such as a semiconductor device. The plasma processing device includes various types of devices such as a capacitive coupling type plasma processing device and an inductive coupling type plasma processing device. In recent years, a plasma processing device of a type of exciting a gas by using microwaves has been used.

Patent Document 1 discloses a plasma processing device using microwaves. The plasma processing device includes a microwave output device outputting a microwave having a bandwidth.

Patent Document 2 discloses a microwave output device having a magnetron as a radio frequency oscillation source. The device includes a voltage control mechanism controlling a voltage to be applied to a radio frequency oscillator from a power supply. The voltage control mechanism includes a load control mechanism performing control such that a voltage corresponding to power obtained by adding power of a travelling wave of a microwave to power calculated on the basis of power of a reflected wave of the microwave is supplied to the radio frequency oscillator.

CITATION LIST

Patent Document

[Patent Document 1] Japanese Unexamined Patent Publication No. 2012-109080
[Patent Document 2] Japanese Unexamined Patent Publication No. 2014-154421

SUMMARY OF INVENTION

Technical Problem

It is necessary to generate stable plasma in manufacturing of an electronic device. The device disclosed in Patent Document 1 can stabilize plasma by output a microwave having a bandwidth. However, even when a microwave having a bandwidth is used, there is a condition in which plasma is unstable.

In order to realize stabilization of plasma, load control disclosed in Patent Document 2 may be applied to the device disclosed in Patent Document 1. Specifically, a device may be considered in which effective power supplied to a chamber main body is controlled to be constant while a microwave having a bandwidth is output.

However, the power of the microwave having a bandwidth disclosed Patent Document 1 is not constant, and the microwave normally has a waveform having different intensities. In the load control disclosed in Patent Document 2, it is necessary to stabilize microwave plasma by immediately supplying power when effective power of a microwave is reduced, and thus there is concern that power may not be immediately supplied.

Thus, there is a desire for a microwave output device and a plasma processing device capable of stably performing load control on a microwave having a bandwidth.

Solution to Problem

According to an aspect, there is provided a microwave output device. The microwave output device includes a microwave generation unit, an output portion, a first directional coupler, a second directional coupler, and a measurement unit. The microwave generation unit generates a microwave having a center frequency, power, and a bandwidth respectively corresponding to a setting frequency, setting power, and a setting bandwidth for which instructions are given from a controller. The output portion outputs the microwave propagating from the microwave generation unit. The first directional coupler outputs parts of travelling waves propagating toward the output portion from the microwave generation unit. The second directional coupler outputs parts of reflected waves returning to the output portion. The measurement unit determines first measured values indicating power levels of the travelling waves in the output portion on the basis of the parts of the travelling waves output from the first directional coupler, and determines second measured values indicating power levels of the reflected waves in the output portion on the basis of the parts of the reflected waves output from the second directional coupler. The microwave generation unit averages the first measured values and the second measured values at a predetermined movement average time and a predetermined sampling interval. The microwave generation unit controls a microwave such that a value obtained by subtracting the averaged second measured value from the averaged first measured value comes close to the setting power. The predetermined movement average time is 60 µs or less, and a relationship of $y \geq 78.178 x^{0.1775}$ is satisfied when the predetermined sampling interval is indicated by x, and the predetermined movement average time is indicated by y.

The microwave output device controls the microwave such that a value obtained by subtracting the second measured values from the first measured values while generating the microwave having a bandwidth comes close to setting power. In other words, load control is performed on the microwave having a bandwidth. In this case, the microwave generation unit averages the first measured values and the second measured values at a predetermined movement average time and a predetermined sampling interval. In an averaging process, the predetermined movement average time is 60 µs or less. In the averaging process, a predetermined sampling interval x and a predetermined movement average time y satisfy a relationship of $y \geq 78.178^{0.1775}$. A microwave is controlled such that a value obtained by subtracting the averaged second measured value from the averaged first measured value comes close to the setting power. The load control is performed under a condition in which a movement average time is 60 µs or less, and the relationship of $y \geq 78.178 x^{0.1775}$ is satisfied, and thus it is possible to stably perform the load control on a microwave having a bandwidth.

In an embodiment, the measurement unit may include a first wave detection unit that generates an analog signal corresponding to power levels of the parts of the travelling waves by using diode wave detection; a first A/D converter that converts the analog signal generated by the first wave detection unit into a digital value; and a first processing unit that selects one or more first correction coefficients correlated with the setting frequency, the setting power, and the setting bandwidth for which instructions are given from the controller from among a plurality of first correction coefficients set in advance to correct the digital value generated by the first A/D converter to power of a travelling wave in the output portion, and determines the first measured values by multiplying the selected one or more first correction coefficients by the digital value generated by the first A/D converter.

The digital value obtained by converting an analog signal generated by the first wave detection unit in the first A/D converter has an error with respect to power of a travelling wave in the output portion. The error has dependency on a setting frequency, setting power, and a setting bandwidth of a microwave. In the microwave output device of the embodiment, a plurality of first correction coefficients are prepared in advance such that one or more first correction coefficients for reducing the error depending on a setting frequency, setting power, and a setting bandwidth are selectable. In the microwave output device, one or more first correction coefficients correlated with a setting frequency, setting power, and a setting bandwidth for which instructions are given from the controller are selected from among the plurality of first correction coefficients, and the one or more first correction coefficients are multiplied by a digital value generated by the first A/D converter, and thus the first measured value is obtained. Therefore, an error between power of a travelling wave in the output portion and the first measured value obtained on the basis of parts of travelling waves output from the first directional coupler is reduced.

In the embodiment, the measurement unit may include a second wave detection unit that generates an analog signal corresponding to power levels of the parts of the reflected waves by using diode wave detection; a second A/D converter that converts the analog signal generated by the second wave detection unit into a digital value; and a second processing unit that selects one or more second correction coefficients correlated with the setting frequency, the setting power, and the setting bandwidth for which instructions are given from the controller from among a plurality of second correction coefficients set in advance to correct the digital value generated by the second A/D converter to power of a reflected wave in the output portion, and determines the second measured values by multiplying the selected one or more second correction coefficients by the digital value generated by the second A/D converter.

The digital value obtained by converting an analog signal generated by the second wave detection unit in the second A/D converter has an error with respect to power of a reflected wave in the output portion. The error has dependency on a setting frequency, setting power, and a setting bandwidth of a microwave. In the microwave output device of the embodiment, a plurality of second correction coefficients are prepared in advance such that one or more second correction coefficients for reducing the error depending on a setting frequency, setting power, and a setting bandwidth are selectable.

In the microwave output device, one or more second correction coefficients correlated with a setting frequency, setting power, and a setting bandwidth for which instructions are given from the controller are selected from among the plurality of second correction coefficients, and the one or more second correction coefficients are multiplied by a digital value generated by the second A/D converter, and thus the second measured value is obtained. Therefore, an error between power of a reflected wave in the output portion and the second measured value obtained on the basis of parts of reflected waves output from the second directional coupler is reduced.

In the embodiment, the microwave generation unit may control the microwave such that the value obtained by subtracting the averaged second measured value from the averaged first measured value comes close to the setting power when a control mode for which an instruction is given from the controller is a first control mode, and control the microwave such that the averaged first measured value comes close to the setting power when a control mode for which an instruction is given from the controller is a second control mode.

As described above, the microwave generation unit can switch a control mode and can thus switch whether or not to perform load control according to a process condition.

In another aspect, there is provided a plasma processing device. The plasma processing device includes a chamber main body and the microwave output device. The microwave output device is configured to output a microwave for exciting a gas to be supplied to the chamber main body. The microwave output device is the microwave output device according to any one of the plurality of aspects and the plurality of embodiments.

Advantageous Effects of Invention

According to the various aspects and embodiments of the present disclosure, the microwave output device and the plasma processing device capable of stably performing load control on a microwave having a bandwidth are provided.

DESCRIPTION OF EMBODIMENTS

Figure 1:
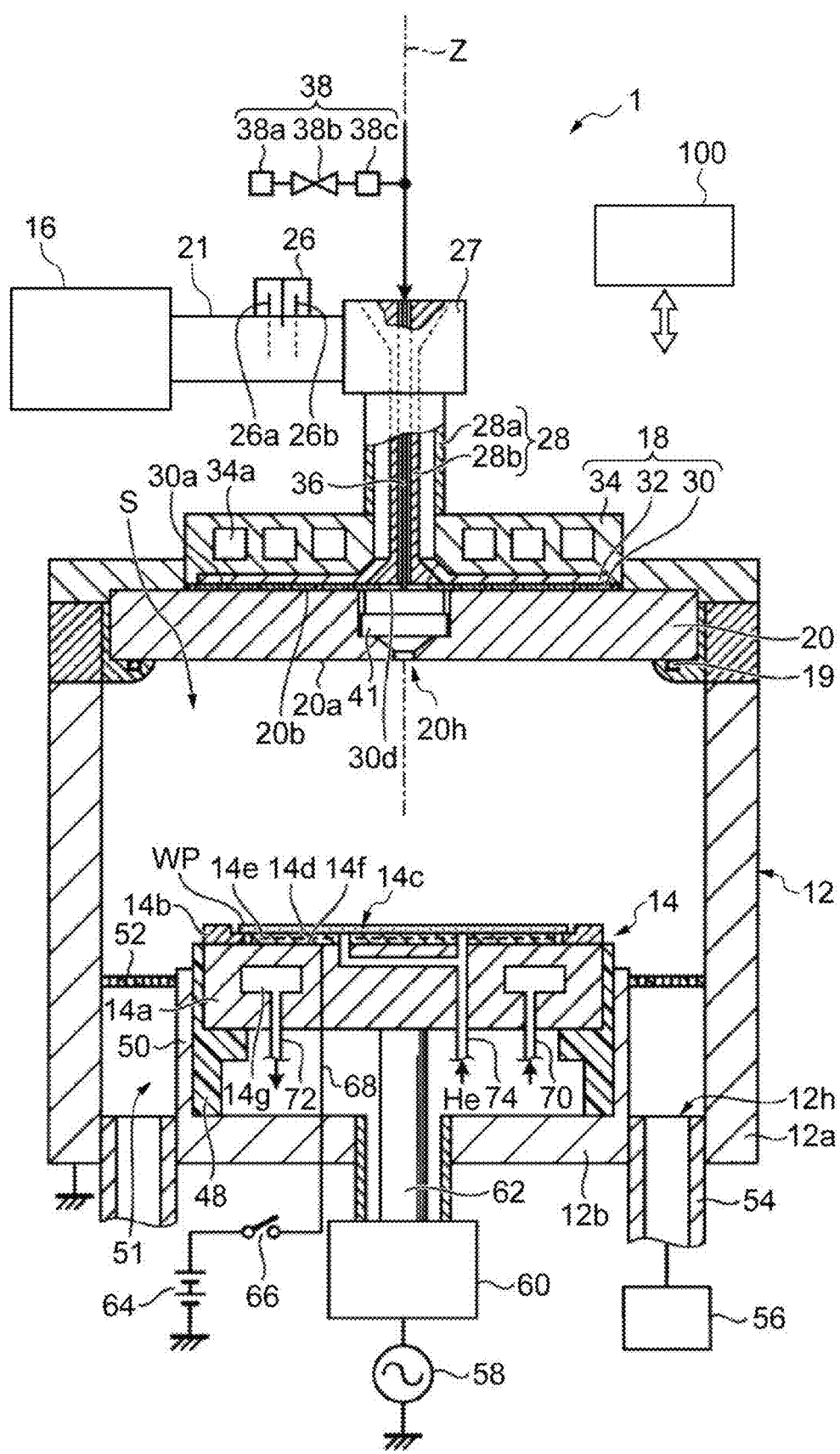
FIG. 1 is a diagram illustrating a plasma processing device according to an embodiment.

Hereinafter, with reference to the drawings, various embodiments will be described in detail. Identical or similar portions are given the same reference numeral throughout the drawings.

[Plasma Processing Device]

FIG. 1 is a diagram illustrating a plasma processing device according to an embodiment. As illustrated in FIG. 1, a plasma processing device 1 includes a chamber main body 12 and a microwave output device 16. The plasma processing device 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axial line of the side wall 12a approximately matches an axial line Z which extends in a vertical direction. The bottom portion 12b is provided on a lower end side of the side wall 12a. An exhaust hole 12h for exhaust is provided in the bottom portion 12b. An upper end of the side wall 12a is an opening.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber main body 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an embodiment, the stage 14 includes a base 14a and an electrostatic chuck 14c. The base 14a has an approximately disc shape, and is formed from a conductive material such as aluminum. A central axial line of the base 14a approximately matches the axial line Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber main body 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.56 MHz with power which is set. The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axial line of the electrostatic chuck 14c approximately matches the axial line Z. The electrode 14d of the electrostatic chuck 14c is configured with a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axial line Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas which is supplied into the chamber main body 12. The microwave output device 16 is configured to variably adjust a frequency, power, and a bandwidth of the microwave. The microwave output device 16 may generate a microwave having a single frequency by setting, for example, a bandwidth of the microwave to substantially 0. The microwave output device 16 may generate a microwave having a bandwidth having a plurality of frequency components. Power levels of the plurality of frequency components may be the same as each other, and only a center frequency component in the bandwidth may have a power level higher than power levels of other frequency components. In an example, the microwave output device 16 may adjust the power of the microwave in a range of 0 W to 5000 W, may adjust the frequency or the center frequency of the microwave in a range of 2400 MHz to 2500 MHz, and may adjust the bandwidth of the microwave in a range of 0 MHz to 100 MHz. The microwave output device 16 may adjust a frequency pitch (carrier pitch)

of the plurality of frequency components of the microwave in the bandwidth in a range of 0 to 25 kHz.

The plasma processing device 1 further includes a waveguide 21, a tuner 26, a mode converter 27, and a coaxial waveguide 28. An output unit of the microwave output device 16 is connected to one end of the waveguide 21. The other end of the waveguide 21 is connected to the mode converter 27. For example, the waveguide 21 is a rectangular waveguide. The tuner 26 is provided in the waveguide 21. The tuner 26 has stubs 26a and 26b. Each of the stubs 26a and 26b is configured to adjust a protrusion amount thereof with respect to an inner space of the waveguide 21. The tuner 26 adjusts a protrusion position of each of the stubs 26a and 26b with respect to a reference position so as to match impedance of the microwave output device 16 with impedance of a load, for example, impedance of the chamber main body 12.

The mode converter 27 converts a mode of the microwave transmitted from the waveguide 21, and supplies the microwave having undergone mode conversion to the coaxial waveguide 28. The coaxial waveguide 28 includes an outer conductor 28a and an inner conductor 28b. The outer conductor 28a has an approximately cylindrical shape, and a central axial line thereof approximately matches the axial line Z. The inner conductor 28b has an approximately cylindrical shape, and extends on an inner side of the outer conductor 28a. A central axial line of the inner conductor 28b approximately matches the axial line Z. The coaxial waveguide 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axial line of the slot plate 30 approximately matches the axial line Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axial line Z. In addition, a through-hole 30d, through which a conduit 36 to be described later can pass, is followed in the central portion of the slot plate 30.

The dielectric plate 32 is formed on the slot plate 30. The dielectric plate 32 is formed from a dielectric material such as quartz, and has an approximately disc shape. A central axial line of the dielectric plate 32 approximately matches the axial line Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. A lower end of the inner conductor 28b passes through a hole formed in a central portion of the cooling jacket 34 and the dielectric plate 32 and is electrically connected to the slot plate 30.

A microwave from the coaxial waveguide 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial waveguide 28. As described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing device 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. The process gas is excited by a microwave which is introduced into the processing space S from the dielectric window 20. According to this, plasma is generated in the processing space S, and the workpiece WP is processed by active species such as ions and/or radicals from the plasma.

The plasma processing device 1 further includes a controller 100. The controller 100 collectively controls respective units of the plasma processing device 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes a keyboard or a touch panel with which a process manager performs a command input operation and the like so as to manage the plasma processing device 1, a display which visually displays an operation situation of the plasma processing device 1 and the like.

The storage unit stores control programs (software) for realizing various kinds of processing executed by the plasma processing device 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing device 1 under the control of the processor.

[Configuration Example of Microwave Output Device 16]

Hereinafter, two examples of the microwave output device 16 will be described in detail.

[First Example of Microwave Output Device 16]

Figure 2:
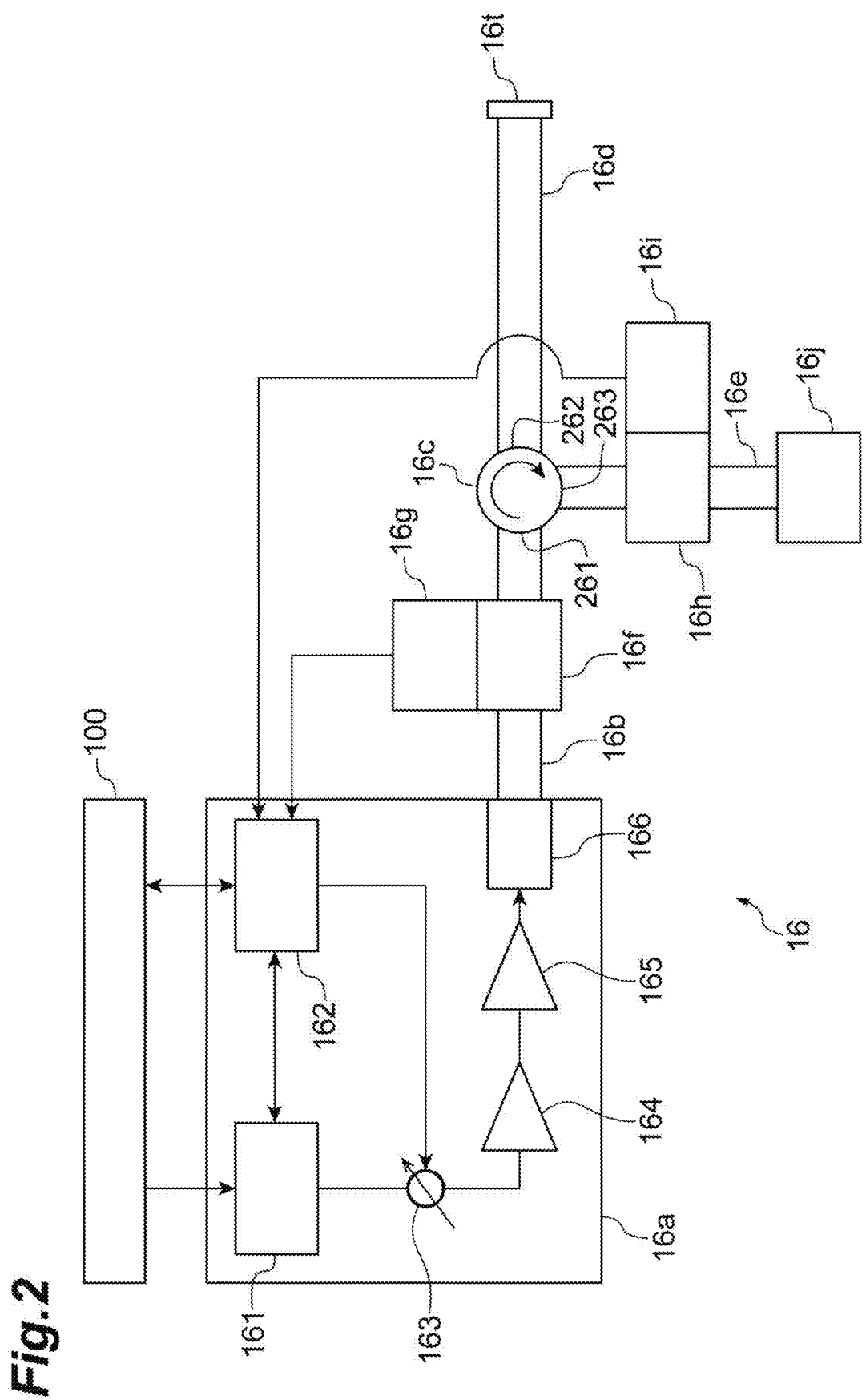
FIG. 2 is a diagram illustrating a microwave output device of a first example.

FIG. 2 is a diagram illustrating a microwave output device of a first example. As illustrated in FIG. 2, the microwave output device 16 includes a microwave generation unit 16a, a waveguide 16b, a circulator 16c, a waveguide 16d, a waveguide 16e, a first directional coupler 16f, a first measurement unit 16g (an example of a measurement unit), a second directional coupler 16h, a second measurement unit 16i (an example of a measurement unit), and a dummy load 16j.

The microwave generation unit 16a includes a waveform generation unit 161, a power control unit 162, an attenuator 163, an amplifier 164, an amplifier 165, and a mode converter 166. The waveform generation unit 161 generates a microwave. The waveform generation unit 161 is connected to the controller 100 and the power control unit 162. A microwave having a frequency (center frequency), a bandwidth, and a carrier pitch respectively corresponding to a setting frequency, a setting between, and a setting pitch designated by the controller 100 is generated. When the controller 100 designates power levels of a plurality of frequency components in a bandwidth via the power control unit 162, the waveform generation unit 161 may generate a microwave including a plurality of frequency components respectively having power levels in which the power levels of the plurality of frequency components designated by the controller 100 are reflected.

An output of the waveform generation unit 161 is connected to the attenuator 163. The attenuator 163 is connected to the power control unit 162. The power control unit 162 may be, for example, a processor. The power control unit 162 controls an attenuation rate (attenuation amount) of a microwave in the attenuator 163 such that a microwave having power corresponding to setting power designated by the controller 100 is output from the microwave output device 16. An output of the attenuator 163 is connected to the mode converter 166 via the amplifier 164 and the amplifier 165. Each of the amplifier 164 and the amplifier 165 amplifies a microwave at a predetermined amplification rate. The mode converter 166 converts a propagation mode of a microwave output from the amplifier 165 from TEM into TE01. A microwave, which is generated through the mode conversion in the mode converter 166, is output as an output microwave of the microwave generation unit 16a.

An output of the microwave generation unit 16a is connected to one end of the waveguide 16b. The other end of the waveguide 16b is connected to a first port 261 of the circulator 16c. The circulator 16c includes a first port 261, a second port 262, and a third port 263. The circulator 16c outputs a microwave, which is input to the first port 261, from the second port 262, and outputs a microwave, which is input to the second port 262, from the third port 263. One end of the waveguide 16d is connected to the second port 262 of the circulator 16c. The other end of the waveguide 16d is an output portion 16t of the microwave output device 16.

One end of the waveguide 16e is connected to the third port 263 of the circulator 16c. The other end of the waveguide 16e is connected to the dummy load 16j. The dummy load 16j receives a microwave which propagates through the waveguide 16e and absorbs the microwave. For example, the dummy load 16j converts the microwave into heat.

The first directional coupler 16f is configured to branch parts of microwaves (that is, travelling waves) which are output from the microwave generation unit 16a and propagate to the output portion 16t, and to output the parts of the travelling waves. The first measurement unit 16g determines a first measured value indicating power of a travelling wave in the output portion 16t on the basis of the parts of the travelling waves output from the first directional coupler 16f.

The second directional coupler 16h is configured to branch parts of reflected waves transmitted to the third port 263 of the c16c with respect to microwaves (that is, reflected waves) which return to the output portion 16t, and to output the parts of the reflected waves. The second measurement unit 16i determines a second measured value indicating power of a reflected wave in the output portion 16t on the basis of the parts of the reflected waves output from the second directional coupler 16h.

The first measurement unit 16g and the second measurement unit 161 are connected to the power control unit 162. The first measurement unit 16g outputs the first measured value to the power control unit 162, and the second measurement unit 16i outputs the second measured value to the power control unit 162. The power control unit 162 controls the attenuator 163 such that a difference between the first measured value and the second measured value, that is, load power (effective power) matches setting power designated by the controller 100, and controls the waveform generation unit 161 as necessary.

In the first example, the first directional coupler 16f is provided between one end and the other end of the waveguide 16b. The second directional coupler 16h is provided between one end and the other end of the waveguide 16e.

[Second Example of Microwave Output Device 16]

Figure 3:
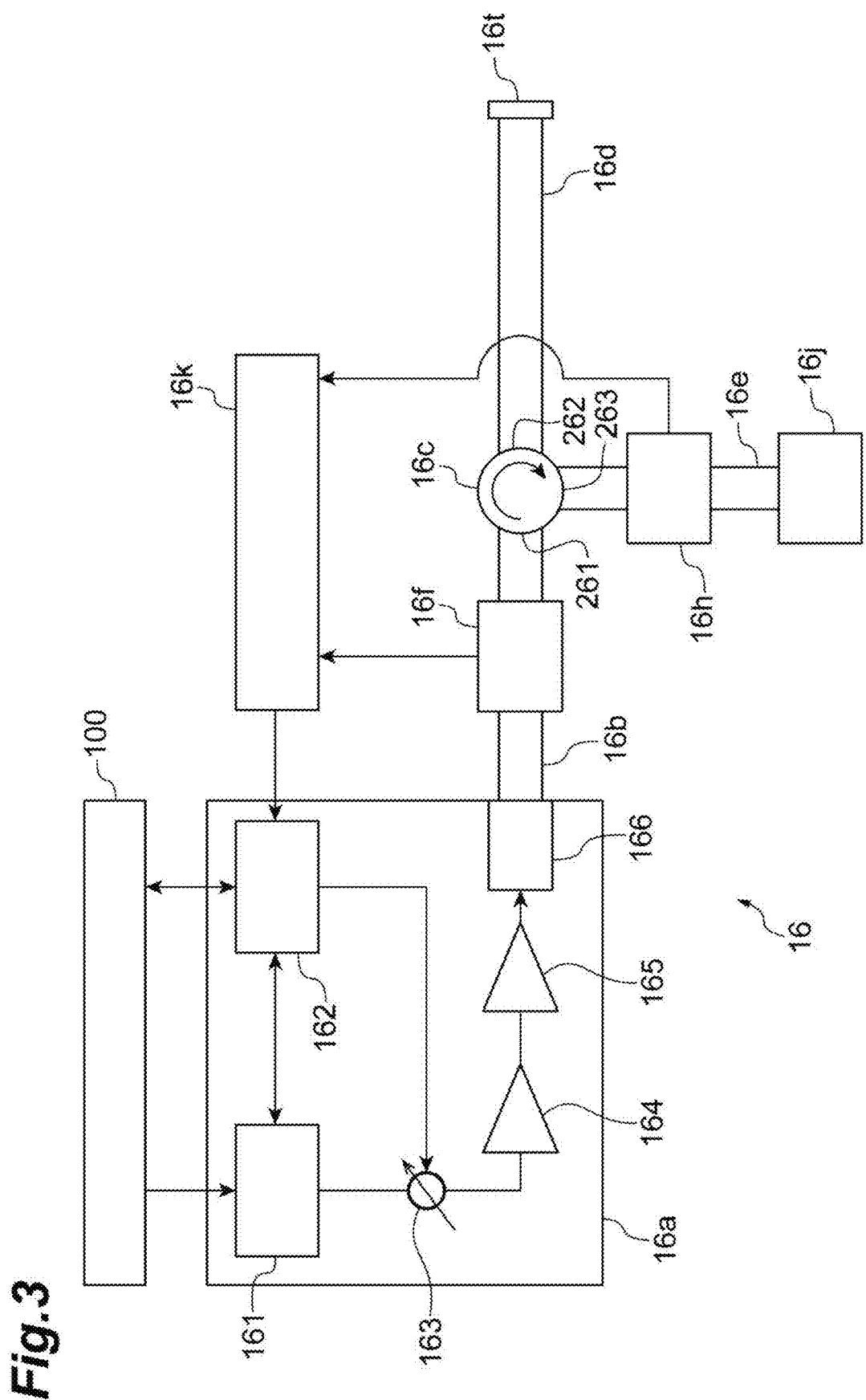
FIG. 3 is a diagram illustrating a microwave output device of a second example.

FIG. 3 is a diagram illustrating a microwave output device of a second example. As illustrated in FIG. 3, the microwave output device 16 of the second example is different from the microwave output device 16 of the first example in that a measurement unit 16k (an example of a measurement unit) into which the first measurement unit 16g and the second measurement unit 16i are integrated is provided, and other configurations are the same.

[Details of Constituent Elements of Microwave Output Device]

[Details of Waveform Generation Unit]

Figure 4:
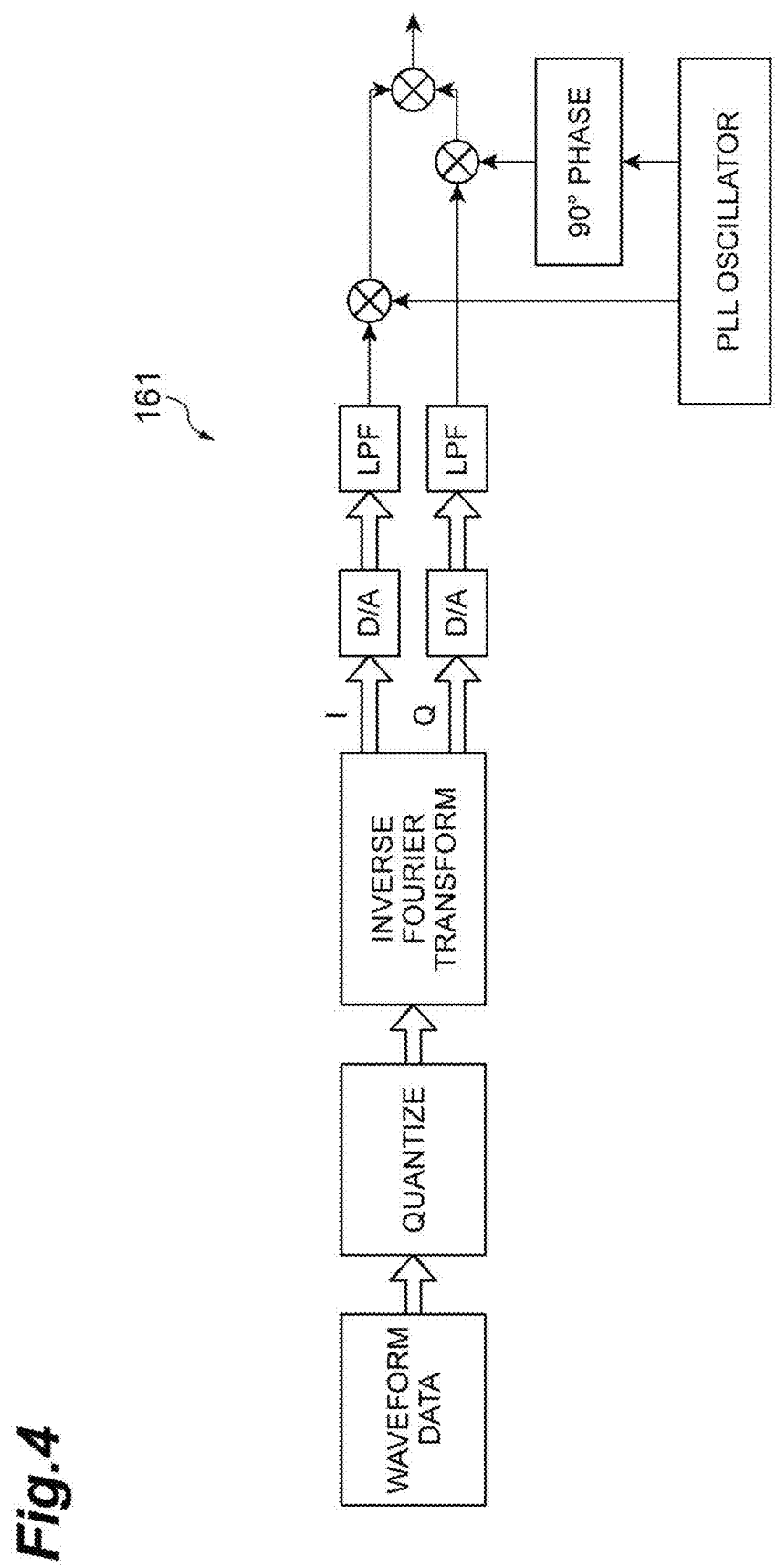
FIG. 4 is a diagram illustrating a microwave generation principle in a waveform generator.

FIG. 4 is a view illustrating a microwave generation principle in the waveform generation unit. As illustrated in FIG. 4, for example, the waveform generation unit 161 includes a phase locked loop (PLL) oscillator which can cause a microwave of which a phase is synchronized with that of a reference frequency to oscillate, and an IQ digital modulator which is connected to the PLL oscillator. The waveform generation unit 161 sets a frequency of a microwave which oscillates in the PLL oscillator to a setting frequency designated by the controller 100. The waveform generation unit 161 modulates a microwave from the PLL oscillator, and a microwave having a phase difference with the microwave from the PLL oscillator by 90° by using the IQ digital modulator. Consequently, the waveform generation unit 161 generates a microwave having a plurality of frequency components in a bandwidth or a microwave having a single frequency.

The waveform generation unit 161 may perform inverse discrete Fourier transform on, for example, N complex data symbols so as to generate a continuous signal and thus to generate a microwave having a plurality of frequency components. A method of generating such a signal may be a method such as an orthogonal frequency division multiple access (OFDMA) modulation method used for digital TV broadcasting (for example, refer to Japanese Patent No. 5320260).

In an example, the waveform generation unit 161 has waveform data expressed by a digitalized code sequence in advance. The waveform generation unit 161 quantizes the waveform data, and applies the inverse Fourier transform to the quantized data so as to generate I data and Q data. The waveform generation unit 161 applies digital/analog (D/A) conversion to each of the I data and the Q data so as to obtain two analog signals. The waveform generation unit 161 inputs the analog signals to a low-pass filter (LPF) through which only a low frequency component passes. The waveform generation unit 161 mixes the two analog signals, which are output from the LPF, with a microwave from the PLL oscillator and a microwave having a phase difference with the microwave from the PLL oscillator by 90°, respectively. The waveform generation unit 161 combines microwaves which are generated through the mixing with each other. Consequently, the waveform generation unit 161 generates a microwave having a single frequency component or a plurality of frequency components.

Figure 5:
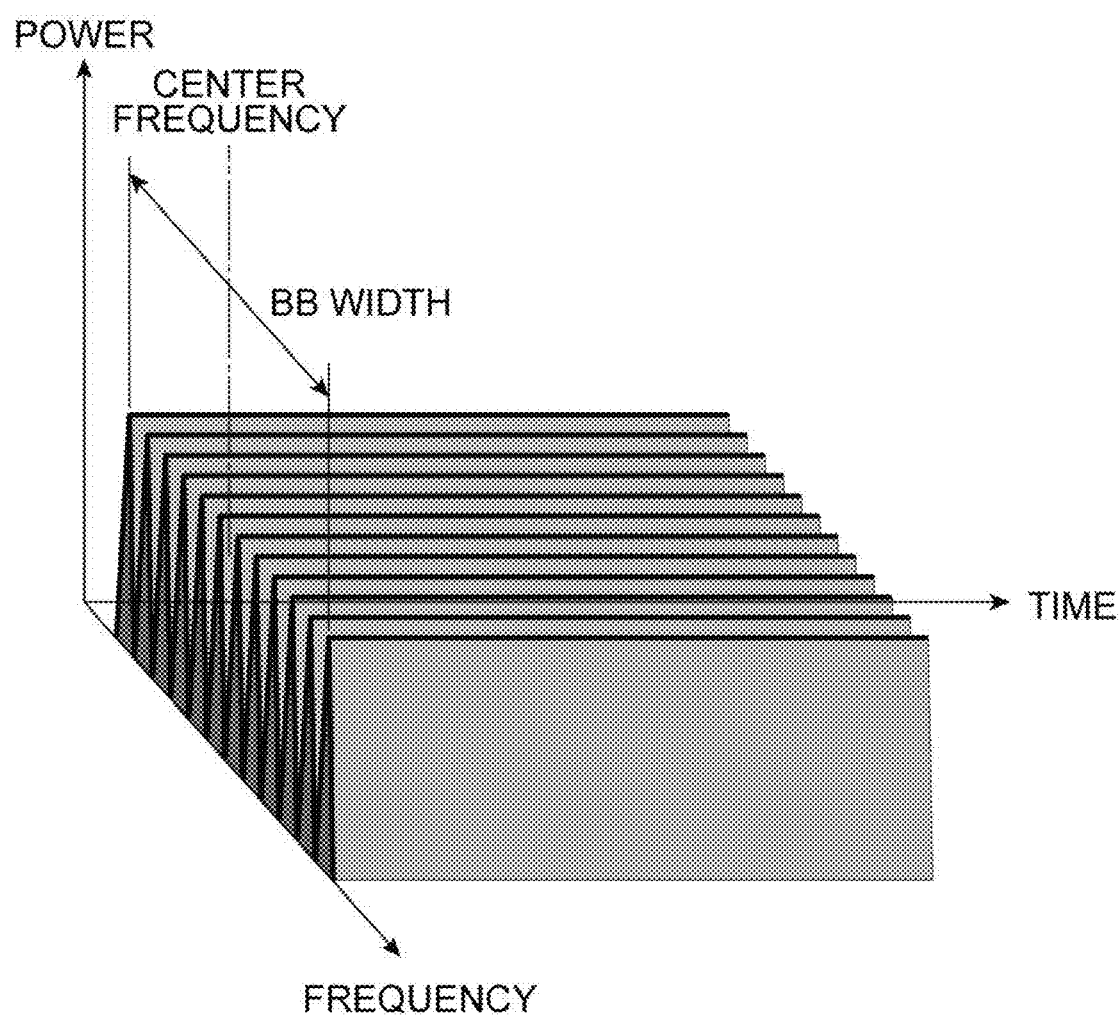
FIG. 5 is a diagram illustrating an example of a microwave generated by the waveform generator.

FIG. 5 is a diagram illustrating an example of a microwave generated by the waveform generation unit. As illustrated in FIG. 5, the waveform generation unit 161 generates a microwave having power, a center frequency, and a bandwidth (BB width) respectively corresponding to setting power, a setting frequency, and a setting bandwidth for which instructions are given from the controller 100.

[Example of First Measurement Unit 16g]

Figure 6:
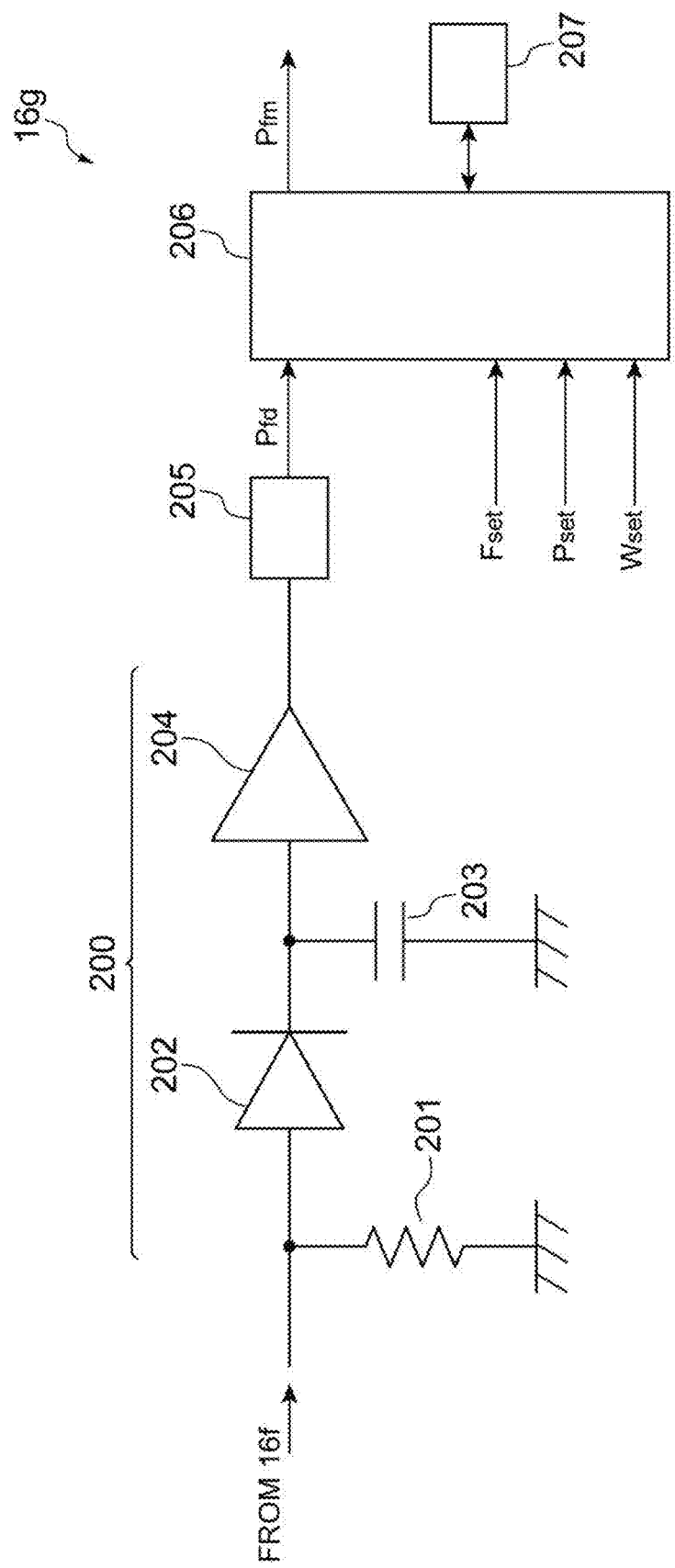
FIG. 6 is a diagram illustrating a first measurement unit of a first example.

FIG. 6 is a diagram illustrating a first measurement unit of a first example. As illustrated in FIG. 6, in the first example, the first measurement unit 16g includes a first wave detection unit 200, a first A/D converter 205, and a first processing unit 206. The first wave detection unit 200 generates an analog signal corresponding to power of parts of travelling waves output from the first directional coupler 16f by using diode wave detection. The first wave detection unit 200 includes a resistive element 201, a diode 202, a capacitor 203, and an amplifier 204. One end of the resistive element 201 is connected to an input of the first measurement unit 16g. Parts of travelling waves output from the first directional coupler 16f are input to the input. The other end of the resistive element 201 is connected to the ground. The diode 202 is, for example, a low barrier Schottky diode. An anode of the diode 202 is connected to the input of the first measurement unit 16g. A cathode of the diode 202 is connected to an input of the amplifier 204. The cathode of the diode 202 is connected to one end of the capacitor 203. The other end of the capacitor 203 is connected to the ground. An output of the amplifier 204 is connected to an input of the first A/D converter 205. An output of the first A/D converter 205 is connected to the first processing unit 206.

In the first measurement unit 16g of the first example, an analog signal (voltage signal) corresponding to power of parts of travelling waves from the first directional coupler 16f is obtained through rectification in the diode 202, smoothing in the capacitor 203, and amplification in the amplifier 204. The analog signal is converted into a digital value $P_{fd}$ in the first A/D converter 205. The digital value $P_{fd}$ has a value corresponding to power of the parts of the travelling waves from the first directional coupler 16f. The digital value $P_{fd}$ is input to the first processing unit 206.

The first processing unit 206 is configured with a processor such as a CPU. The first processing unit 206 is connected to a storage device 207. The storage device 207 stores a plurality of first correction coefficients for correcting the digital value $P_{fd}$ to power of a travelling wave in the output portion 16t. In the first processing unit 206, a setting frequency $F_{set}$, setting power $P_{set}$, and a setting bandwidth $W_{set}$ designated for the microwave generation unit 16a are designated by the controller 100. The first processing unit 206 selects one or more first correction coefficients correlated with the setting frequency $F_{set}$, the setting power $P_{set}$, and the setting bandwidth $W_{set}$ from among the plurality of first correction coefficients, and determines a first measured value $P_{fm}$ by multiplying the selected first correction coefficients by the digital value $P_{fd}$.

As an example, a plurality of preset first correction coefficients $k_f(F,P,W)$ are stored in the storage device 207. Here, F indicates a frequency, and the number of F is the number of a plurality of frequencies which can be designated for the microwave generation unit 16a. P indicates power, and the number of P is the number of a plurality of power levels which can be designated for the microwave generation unit 16a. W indicates a bandwidth, and the number of W is the number of a plurality of bandwidths which can be designated for the microwave generation unit 16a. The plurality of bandwidths which can be designated for the microwave generation unit 16a also include a bandwidth of about 0. A microwave having a bandwidth of about 0 is a single-frequency microwave, that is, a single-mode (SP) microwave.

When the plurality of first correction coefficients $k_f(F,P,W)$ are stored in the storage device 207, the first processing unit 206 selects $k_f(F_{set},P_{set},W_{set})$, and determines the first measured value $P_{fm}$ by performing calculation of $P_{fm}=k_f(F_{set},P_{set},W_{set})\times P_{fd}$.

As another example, a plurality of first coefficients $k1_f(F)$, a plurality of second coefficients $k2_f(P)$, and a plurality of third coefficients $k3_f(W)$ are stored as the plurality of first correction coefficients in the storage device 207. Here, F, P, and W are the same as F, P, and W in the first correction coefficients $k_f(F,P,W)$.

When the plurality of first coefficients $k1_f(F)$, the plurality of second coefficients $k2_f(P)$, and the plurality of third coefficients $k3_f(W)$ are stored as the plurality of first correction coefficients in the storage device 207, the first processing unit 206 selects $k1_f(F_{set})$, $k2_f(P_{set})$, and $k3_f(W_{set})$, and determines the first measured value $P_{fm}$ by performing calculation of $P_{fm}=k1_f(F_{set})\times k2_f(P_{set})\times k3_f(W_{set})\times P_{fd}$.

The digital value $P_{fd}$ obtained by converting an analog signal generated by the first wave detection unit 200 of the first measurement unit 16g of the first example illustrated in FIG. 6 in the first A/D converter 205 has an error with respect to power of a travelling wave in the output portion 16t. The error has dependency on a setting frequency, setting power, and a setting bandwidth of a microwave. A factor of the dependency lies in diode wave detection. In the first measurement unit 16g of the first example, one or more first correction coefficients, that is, $k_f(F_{set},P_{set},W_{set})$ or $k1_f(F_{set})$, $k2_f(P_{set})$, and $k3_f(W_{set})$ correlated with the setting frequency $F_{set}$, the setting power $P_{set}$, and the setting bandwidth $W_{set}$ for which instructions are given from the controller 100 are selected from among a plurality of first correction coefficients which are prepared in advance to reduce the error. The selected one or more first correction coefficients are multiplied by the digital value $P_{fd}$. Consequently, the first measured value $P_{fm}$ is obtained. Therefore, an error between power of a travelling wave in the output portion 16t and the first measured value $P_{fm}$, obtained on the basis of parts of travelling waves output from the first directional coupler 16f is reduced.

The number of a plurality of first correction coefficients $k_f(F,P,W)$ is a product of the number of frequencies which can be designated as a setting frequency, the number of power levels which can be designated as setting power, and the number of bandwidths which can be designated as a setting bandwidth. On the other hand, when a plurality of first coefficients $k1_f(F)$, a plurality of second coefficients $k2_f(P)$, and a plurality of third coefficients $k3_f(W)$ are used, the number of a plurality of first correction coefficients is a sum of the number of a plurality of first coefficients $k1_f(F)$, the number of a plurality of second coefficients k2$_r$(P), and the number of a plurality of third coefficients k3$_r$(W). Therefore, when a plurality of first coefficients k1$_r$(F), a plurality of second coefficients k2$_r$(P), and a plurality of third coefficients k3$_r$(W) are used, the number of a plurality of first correction coefficients can be reduced compared with a case of using a plurality of first correction coefficients k$_f$(F,P,W).

When the correction is not performed, the microwave output device may not include the first processing unit 206.

[First Example of Second Measurement Unit 16i]

Figure 7:
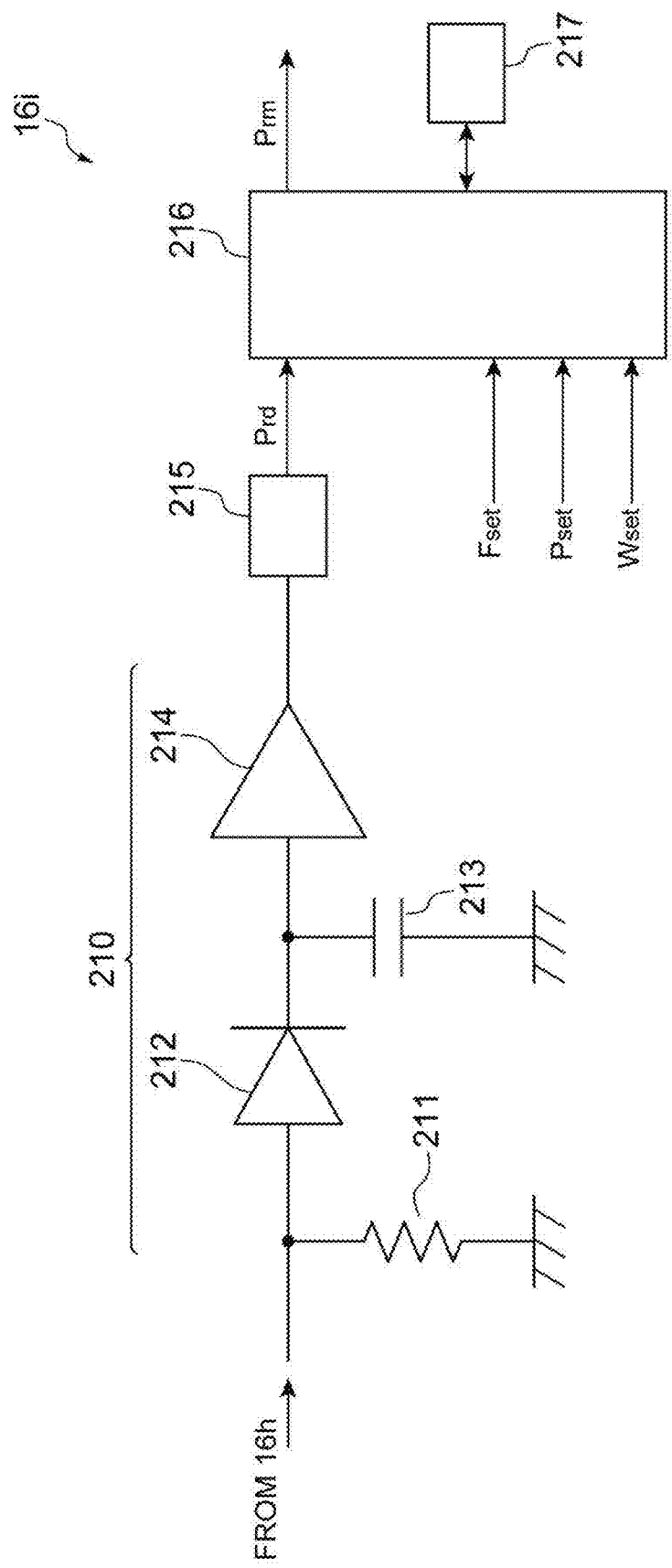
FIG. 7 is a diagram illustrating a second measurement unit of the first example.

FIG. 7 is a diagram illustrating a second measurement unit of the first example. As illustrated in FIG. 7, in the first example, the second measurement unit 16i includes a second wave detection unit 210, a second A/D converter 215, and a second processing unit 216. In the same manner as the first wave detection unit 200, the second wave detection unit 210 generates an analog signal corresponding to power of parts of reflected waves output from the second directional coupler 16h by using diode wave detection. The second wave detection unit 210 includes a resistive element 211, a diode 212, a capacitor 213, and an amplifier 214. One end of the resistive element 211 is connected to an input of the second measurement unit 16i. Parts of reflected waves output from the second directional coupler 16h are input to the input. The other end of the resistive element 211 is connected to the ground. The diode 212 is, for example, a low barrier Schottky diode. An anode of the diode 212 is connected to the input of the second measurement unit 16i. A cathode of the diode 212 is connected to an input of the amplifier 214. The cathode of the diode 212 is connected to one end of the capacitor 213. The other end of the capacitor 213 is connected to the ground. An output of the amplifier 214 is connected to an input of the second A/D converter 215. An output of the second A/D converter 215 is connected to the second processing unit 216.

In the second measurement unit 16i of the first example, an analog signal (voltage signal) corresponding to power of parts of reflected waves from the second directional coupler 16h is obtained through rectification in the diode 212, smoothing in the capacitor 213, and amplification in the amplifier 214. The analog signal is converted into a digital value P$_{rd}$ in the second A/D converter 215. The digital value P$_{rd}$ has a value corresponding to power of the parts of the reflected waves from the second directional coupler 16h. The digital value P$_{rd}$ is input to the second processing unit 216.

The second processing unit 216 is configured with a processor such as a CPU. The second processing unit 216 is connected to a storage device 217. The storage device 217 stores a plurality of second correction coefficients for correcting the digital value P$_{rd}$ to power of a reflected wave in the output portion 16t. In the second processing unit 216, the setting frequency F$_{set}$, setting power P$_{set}$, and a setting bandwidth W$_{set}$, designated for the microwave generation unit 16a are designated by the controller 100. The second processing unit 216 selects one or more second correction coefficients correlated with the setting frequency F$_{set}$, the setting power P$_{set}$, and the setting bandwidth W$_{set}$ from among the plurality of second correction coefficients, and determines a second measured value P$_{rm}$ by multiplying the selected second correction coefficients by the digital value P$_{rd}$.

As an example, a plurality of preset second correction coefficients k$_r$(F,P,W) are stored in the storage device 217. Here, F, P, and W are the same as F, P, and W in the first correction coefficients k$_f$(F,P,W).

When the plurality of second correction coefficients k$_r$(F,P,W) are stored in the storage device 217, the second processing unit 216 selects k$_r$(F$_{set}$,P$_{set}$,W$_{set}$), and determines the second measured value P$_{rm}$ by performing calculation of P$_{rm}$=k$_r$(F$_{set}$,P$_{set}$,W$_{set}$)×P$_{rd}$.

As another example, a plurality of fourth coefficients k1$_r$(F), a plurality of fifth coefficients k2$_r$(P), and a plurality of sixth coefficients k3$_r$(W) are stored as the plurality of second correction coefficients in the storage device 217. Here, F, P, and W are the same as F, P, and W in the first correction coefficients k$_r$(F,P,W).

When the plurality of fourth coefficients k1$_r$(F), the plurality of fifth coefficients k2$_r$(P), and the plurality of sixth coefficients k3$_r$(W) are stored as the plurality of second correction coefficients in the storage device 217, the second processing unit 216 selects k1$_r$(F$_{set}$), k2$_r$(P$_{set}$), and k3$_r$(W$_{set}$), and determines the second measured value P$_{rm}$ by performing calculation of P$_{rm}$=k1$_r$(F$_{set}$)×k2$_r$(P$_{set}$)×k3$_r$(W$_{set}$)×P$_{rd}$.

The digital value P$_{rd}$ obtained by converting an analog signal generated by the second wave detection unit 210 of the second measurement unit 16i of the first example illustrated in FIG. 7 in the second A/D converter 215 has an error with respect to power of a reflected wave in the output portion 16t. The error has dependency on a setting frequency, setting power, and a setting bandwidth of a microwave. A factor of the dependency lies in diode wave detection. In the second measurement unit 16i of the first example, in order to reduce the error, one or more second correction coefficients, that is, k$_r$(F$_{set}$,P$_{set}$,W$_{set}$), or k1$_r$(F$_{set}$), k2$_r$(P$_{set}$), and k3$_r$(W$_{set}$) correlated with the setting frequency F$_{set}$, the setting power P$_{set}$, and the setting bandwidth W$_{set}$ for which instructions are given from the controller 100 are selected from among a plurality of second correction coefficients which are prepared in advance. The selected one or more second correction coefficients are multiplied by the digital value P$_{rd}$. Consequently, the second measured value P$_{rm}$ is obtained. Therefore, an error between power of a reflected wave in the output portion 16t and the second measured value P$_{rm}$ obtained on the basis of parts of reflected waves output from the second directional coupler 16h is reduced.

The number of a plurality of second correction coefficients k$_r$(F,P,W) is a product of the number of frequencies which can be designated as a setting frequency, the number of power levels which can be designated as setting power, and the number of bandwidths which can be designated as a setting bandwidth. On the other hand, when a plurality of fourth coefficients k1$_r$(F), a plurality of fifth coefficients k2$_r$(P), and a plurality of sixth coefficients k3$_r$(W) are used, the number of a plurality of fourth coefficients k1$_r$(F), the number of a plurality of fifth coefficients k2$_r$(P), and the number of a plurality of sixth coefficients k3$_r$(W). Therefore, a plurality of fourth coefficients k1$_r$(F), a plurality of fifth coefficients k2$_r$(P), and a plurality of sixth coefficients k3$_r$(W) are used, the number of a plurality of second correction coefficients can be reduced compared with a case of using a plurality of second correction coefficients k$_r$(F,P,W).

When the correction is not performed, the microwave output device may not include the second processing unit 216.

[Measurement Unit 16k]

As described above, the measurement unit 16k is configured by integrating the first measurement unit 16g with the second measurement unit 16i. The measurement unit 16k has functions (the same functions) corresponding to the first measurement unit 16g and the second measurement unit 16i.

[Example of Power Feedback]

In the microwave output device 16, the power control unit 162 controls power of a microwave output from the microwave output device 16 such that a difference between the first measured value $P_{fm}$ and the second measured value $P_{rm}$, comes close to setting power designated by the controller 100, and thus load power of a microwave supplied to a load coupled to the output portion 16t can be made close to the setting power.

Figure 8:
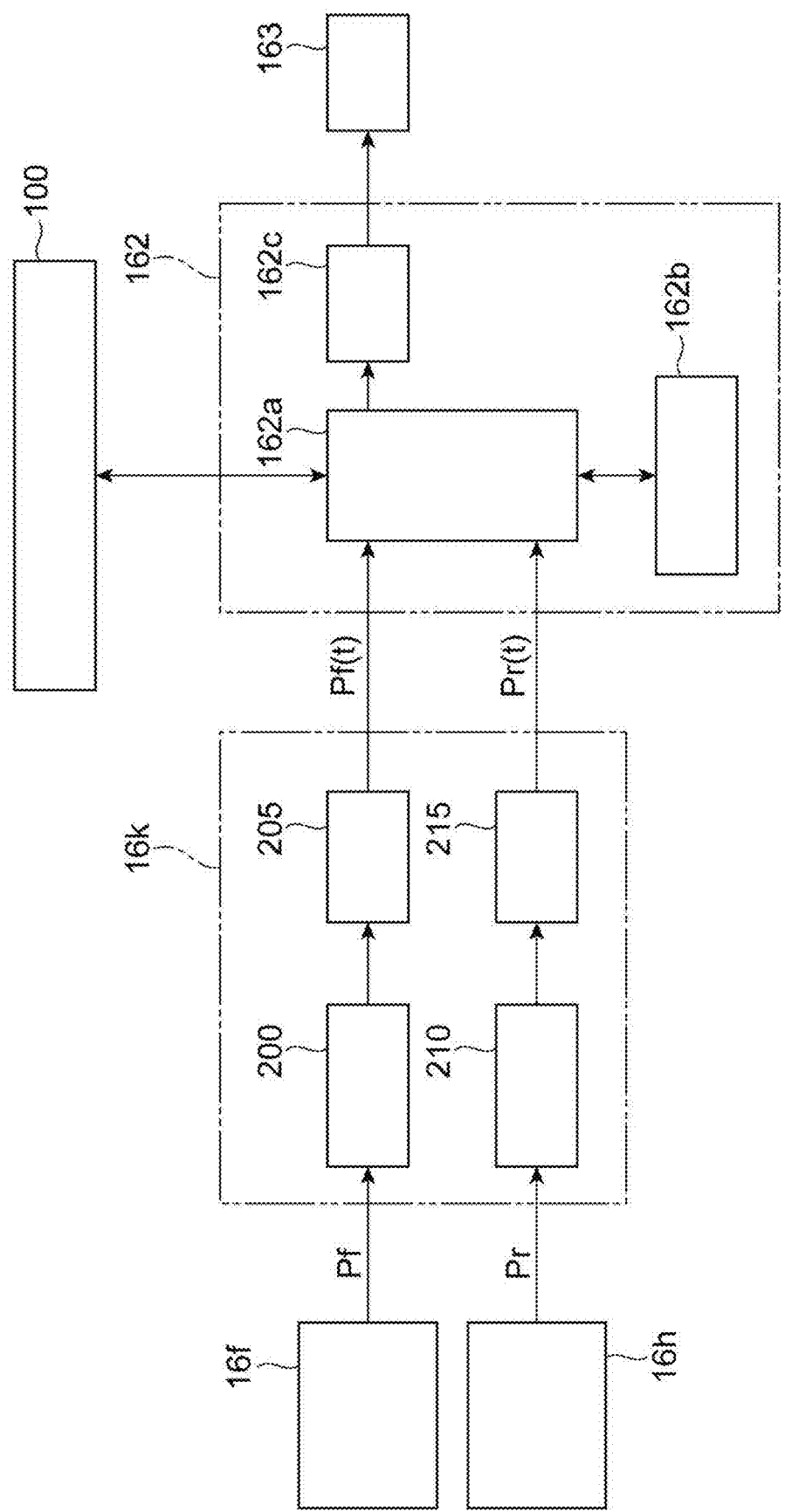
FIG. 8 is a diagram illustrating an example of a configuration regarding power feedback.

FIG. 8 is a diagram illustrating an example of a configuration regarding power feedback. A difference between the first example and the second example of the microwave output device 16 is only whether or not the first measurement unit 16g and the second measurement unit 16i are integrated with each other. Therefore, hereinafter, the second example of the microwave output device 16 will be described as a representative.

As illustrated in FIG. 8, the power feedback is realized by the first directional coupler 16f, the second directional coupler 16h, the measurement unit 16k, the power control unit 162, and the attenuator 163.

As described above, the first directional coupler 16f and the second directional coupler 16h are coupled to the measurement unit 16k. The measurement unit 16k includes the first wave detection unit 200, the first A/D converter 205, the second wave detection unit 210, and the second A/D converter 215. In FIG. 8, the first processing unit 206 and the second processing unit 216 are not illustrated.

The first wave detection unit 200 obtains an analog signal (voltage signal) corresponding to power Pf of parts of travelling waves from the first directional coupler 16f. The analog signal is converted into a digital value Pf(t) by the first A/D converter 205. The second wave detection unit 210 obtains an analog signal (voltage signal) corresponding to power Pr of parts of reflected waves from the second directional coupler 16h. The analog signal is converted into a digital value Pr(t) by the second A/D converter 215.

The power control unit 162 includes a power processing unit 162a, a storage unit 162b, and a D/A converter 162c.

The power processing unit 162a is configured with a processor such as a CPU. The power processing unit 162a is coupled to a storage device 314. The power processing unit 162a acquires setting power, a setting frequency, a control mode (a PL mode (an example of a first control mode), a Pf mode (an example of a second control mode)), and a bandwidth (BB width) designated by the controller 100. The power processing unit 162a acquires the digital value Pf(t) and the digital value Pr(t) from the measurement unit 16k. When a control mode is the PL mode (an example of a first control mode), the power processing unit 162a sets the present value PM of a value to be controlled to a value obtained by subtracting the digital value Pr(t) from the digital value Pf(t). When a control mode is the Pr mode, the power processing unit 162a sets the present value PM of a value to be controlled to the digital value Pf(t). The power processing unit 162a compares the present value PM of a value to be controlled with the setting power, and adjusts an attenuation amount (attenuation rate) of the attenuator 163. Consequently, load power of a microwave supplied to a load coupled to the output portion 16t can be made close to the setting power.

The attenuator 163 is a device which can changes an attenuation amount (attenuation rate) according to an applied voltage value as an example. The power processing unit 162a compares the present value PM of a value to be controlled with the setting power, thus determines an applied voltage value for the attenuator 163, and outputs the applied voltage value to the attenuator 163 via the D/A converter 162c. For example, when the digital value Pf(t) is the same as the setting power, the power processing unit 162a outputs an applied voltage value corresponding to power corresponding to a value obtained by adding the digital value Pf(t) to the digital value Pr(t).

[Example of Data Sampling in Power Processing Unit]

Figure 9:
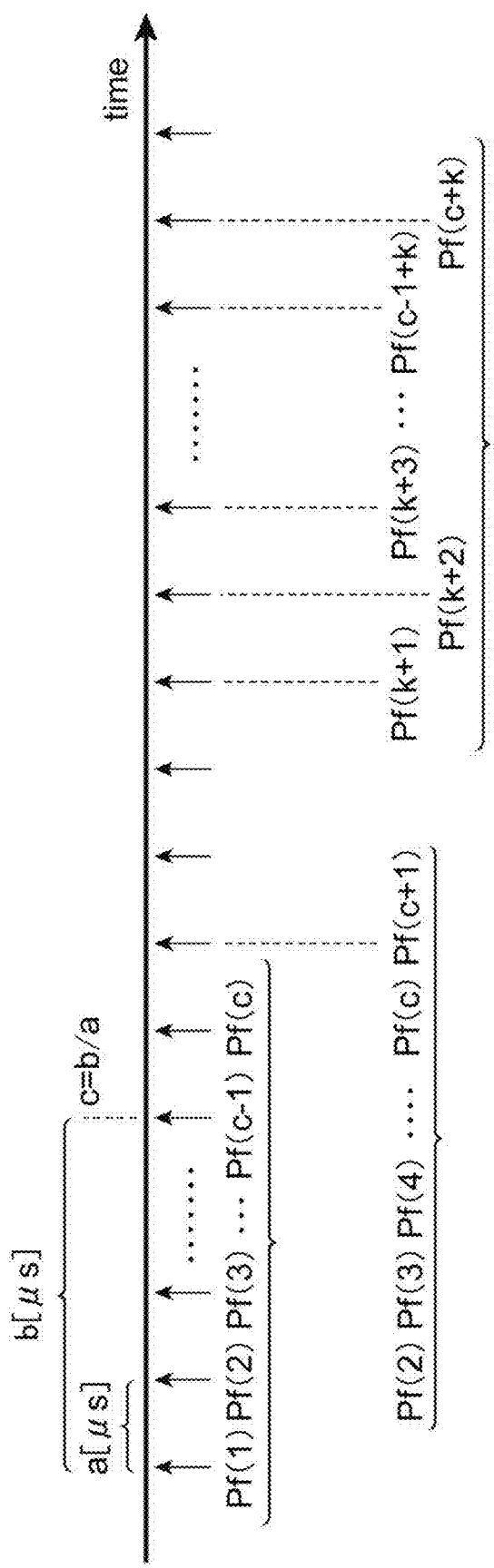
FIG. 9 is a diagram for describing an example of a movement average.

FIG. 9 is a diagram for describing an example of a movement average. In FIG. 9, a indicates a sampling interval [μs], b indicates a movement average time [μs] and c indicates the number of samples. The number of samples c is expressed by b/a. At a time point t=0, the power processing unit 162a acquires and averages c samples from Pf(1) to Pf(c) at the sampling interval a. At a time point t=1, the power processing unit 162a acquires and averages c samples from Pf(2) to Pf(c+1) at the sampling interval a. At a time point t=k, the power processing unit 162a acquires and averages c samples from Pf(k+1) to Pf(c+k) at the sampling interval a. This is expressed by equations as follows.

$$Pf(t) = \frac{1}{c}\sum_{n=1}^{c} pf(n) \text{ at } t = 0$$

$$Pf(t) = \frac{1}{c}\sum_{n=1}^{c} pf(n+1) \text{ at } t = 1$$

$$\ldots$$

$$Pf(t) = \frac{1}{c}\sum_{n=1}^{c} pf(n+k) \text{ at } t = k$$

Consequently, a power waveform having different intensities is averaged. In the above example, an example of a travelling wave has been described, but a reflected wave may be averaged in the same method.

[Operation of Plasma Processing Device]

Figure 10:
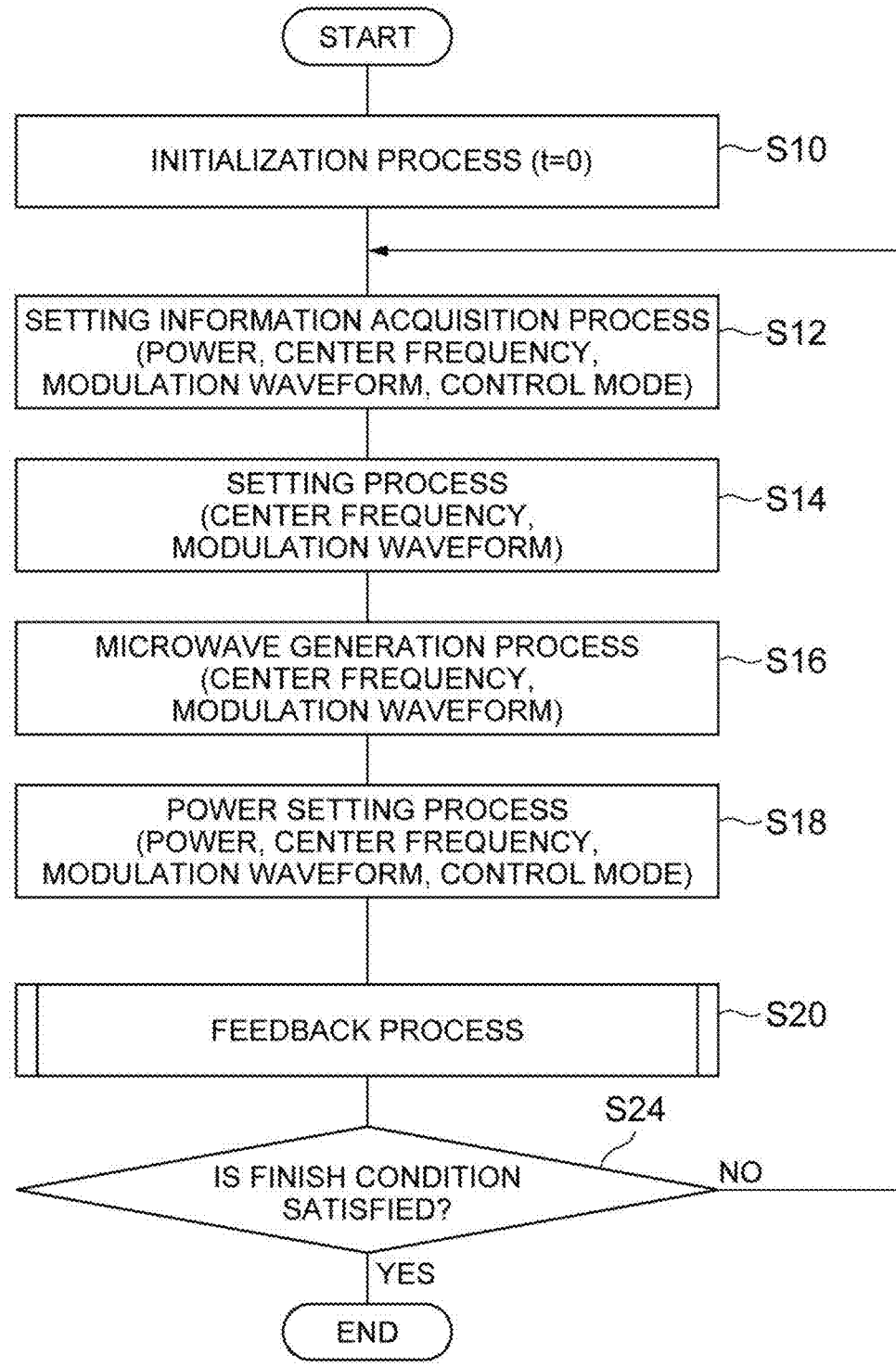
FIG. 10 is a flowchart illustrating an example of an operation of the plasma processing device.

FIG. 10 is a flowchart illustrating an example of the plasma processing device. The flowchart of FIG. 10 is started, for example, when an operator of the plasma processing device 1 gives an instruction for outputting a microwave.

The controller 100 of the plasma processing device 1 sets a counter t to 0 as an initialization process (S10). Subsequently, the controller 100 acquires power setting information (setting power, a center frequency, a modulation waveform (bandwidth), and a control mode) on the basis of an input operation from the operator or recipe information as a setting information acquisition process (S12).

The controller 100 outputs a center frequency and a bandwidth of a microwave to the waveform generation unit 161 of the microwave output device 16 as a setting process (S14). When the information is received, the waveform generation unit 161 generates a microwave having the set center frequency and bandwidth as a generation process (S16).

Subsequently, the controller 100 outputs setting power, a center frequency, a modulation waveform (bandwidth), and a control mode of a microwave to the power control unit 162 of the microwave output device 16 as a power setting process.

The power control unit 162 performs a feedback process of power of a microwave as a feedback process (S20). Details thereof will be described later.

Subsequently, the controller 100 determines whether or not a finish condition is satisfied as a finish determination (S24). The finish condition is a finish condition of interrupting output of a microwave, and is set in advance. For example, the controller 100 determines whether or not the finish condition of interrupting output of a microwave is satisfied on the basis of a finish operation signal from an operator or recipe information.

When it is determined that the finish condition is not satisfied (S24: NO), the power control unit 162 performs the feedback process (S20) again. When it is determined that the finish condition is satisfied (S24: YES), the plasma processing device 1 finishes the process illustrated in FIG. 10.

[Details of Feedback Process]

Figure 11:
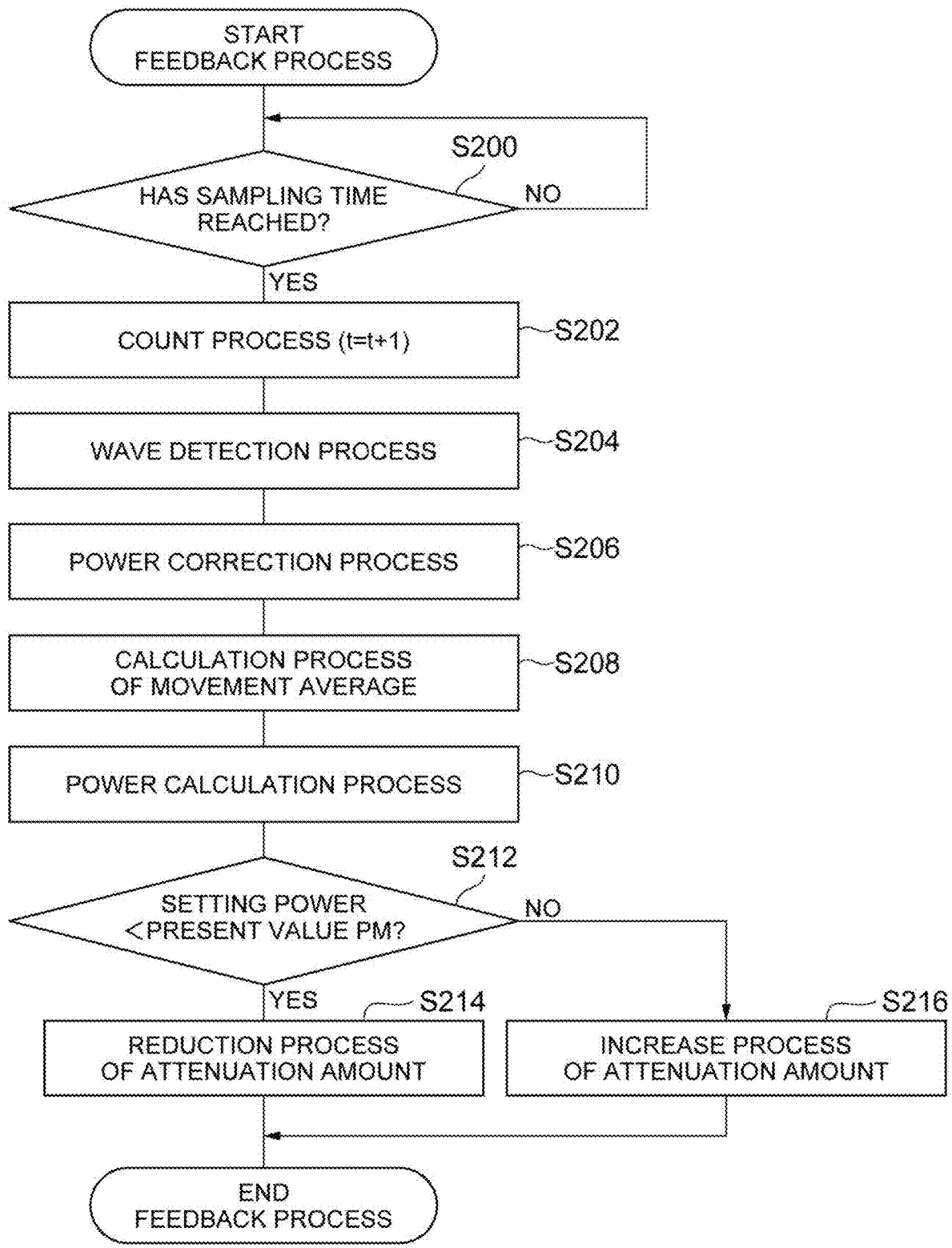
FIG. 11 is a flowchart illustrating an example of a feedback process in a power control unit.

FIG. 11 is a flowchart illustrating an example of the feedback process in the power control unit. The flowchart of FIG. 11 illustrates the feedback process (S20) in FIG. 10 in detail.

The power control unit 162 determines whether or not an elapsed time from the previous sampling has reached a sampling time a as a time determination process (S200). When it is determined that the elapsed time has not reached the sampling time a (S200: NO), the power control unit 162 stands by for a predetermined period, and performs the time determination process (S200) again. When it is determined that the elapsed time has reached the sampling time a (S200: YES), the power control unit 162 increments the counter t by 1 (t=t+1) as a count process (S202).

Subsequently, the measurement unit (the first measurement unit 16g and the second measurement unit 16i or the measurement unit 16k) performs wave detection as a wave detection process (S204). As an example, the first wave detection unit 200 of the measurement unit 16k obtains an analog signal (voltage signal) corresponding to the power Pf of parts of travelling waves from the first directional coupler 16f. The analog signal is converted into a digital value Pf(t) by the first A/D converter 205. The second wave detection unit 210 of the measurement unit 16k obtains an analog signal (voltage signal) corresponding to the power Pr of parts of reflected waves from the second directional coupler 16h. The analog signal is converted into a digital value Pr(t) by the second A/D converter 215.

Subsequently, the measurement unit (the first measurement unit 16g and the second measurement unit 16i or the measurement unit 16k) performs correction as a power correction process (S206). For example, the measurement unit 16k selects one or more first correction coefficients, that is, $k_f(F_{set}, P_{set}, W_{set})$ or $k1_f(F_{set})$, $k2_f(P_{set})$, $k3_f(W_{set})$ respectively correlated with the setting frequency $F_{set}$, the setting power $P_{set}$, and the setting bandwidth $W_{set}$ for which instructions are given from the controller 100, from among a plurality of first correction coefficients prepared in advance. The measurement unit 16k multiplies the selected one or more first correction coefficients by the digital value $P_{fd}$. Consequently, the first measured value $P_{fm}$ is obtained. Similarly, the measurement unit 16k selects one or more second correction coefficients, that is, $k_r(F_{set}, P_{set}, W_{set})$ or $k1_r(F_{set})$, $k2_r(P_{set})$, $k3_r(W_{set})$ respectively correlated with the setting frequency $F_{set}$, the setting power $P_{set}$, and the setting bandwidth $W_{set}$ for which instructions are given from the controller 100, from among a plurality of second correction coefficients prepared in advance. The measurement unit 16k multiplies the selected one or more second correc-tion coefficients by the digital value $P_{rd}$. Consequently, the second measured value $P_{rm}$ is obtained.

Subsequent, the power control unit 162 calculates a movement average as a calculation process (S208). The power control unit 162 calculates a movement average of the first measured value $P_{fm}$ and the second measured value $P_{rm}$ by using the equation described with reference to FIG. 9.

Subsequently, the power control unit 162 calculates the present value PM of a value to be controlled as a power calculation process (S210). When a control mode is the PL mode (an example of a first control mode), the power processing unit 162a sets the present value PM of a value to be controlled to a value obtained by subtracting the second measured value $P_{rm}$ from the first measured value $P_{fm}$. On the other hand, when a control mode is a $P_f$ mode, the power control unit 162 sets the present value PM of a value to be controlled to the first measured value $P_{fm}$.

Subsequently, the power control unit 162 compares the present value PM with the setting power as a power determination process (S212). When it is determined that the setting power is less than the present value PM (S212: YES), the power control unit 162 reduces an attenuation amount (attenuation rate) of the attenuator 163 as a reduction process (S214). When it is determined that the setting power is not less than the present value PM (S212: NO), the power control unit 162 increases an attenuation amount (attenuation rate) of the attenuator 163 as an increase process (S216).

When the reduction process (S214) or the increase process (S216) is finished, the plasma processing device 1 finishes the process illustrated in FIG. 11.

[Relationship Between Sampling Interval and Movement Average Time]

Figure 12:
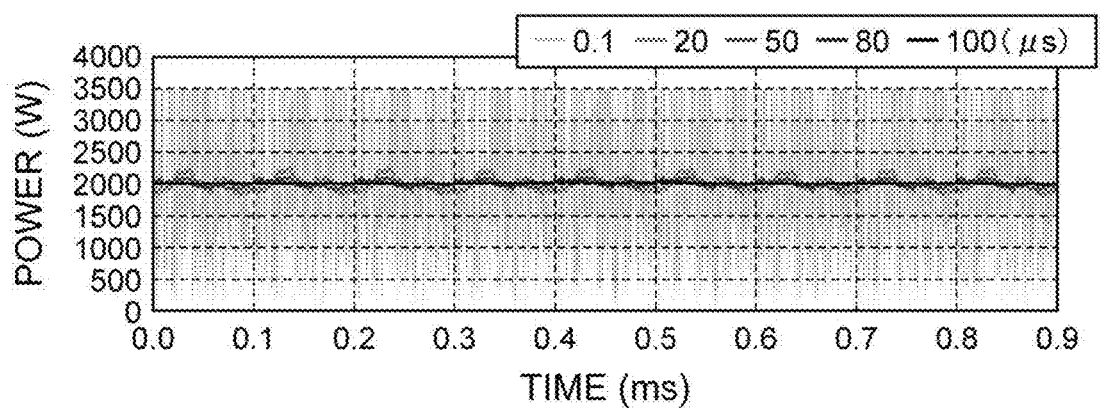
FIG. 12 is a graph indicating a relationship between power of a travelling wave of a microwave and time.
Figure 12:
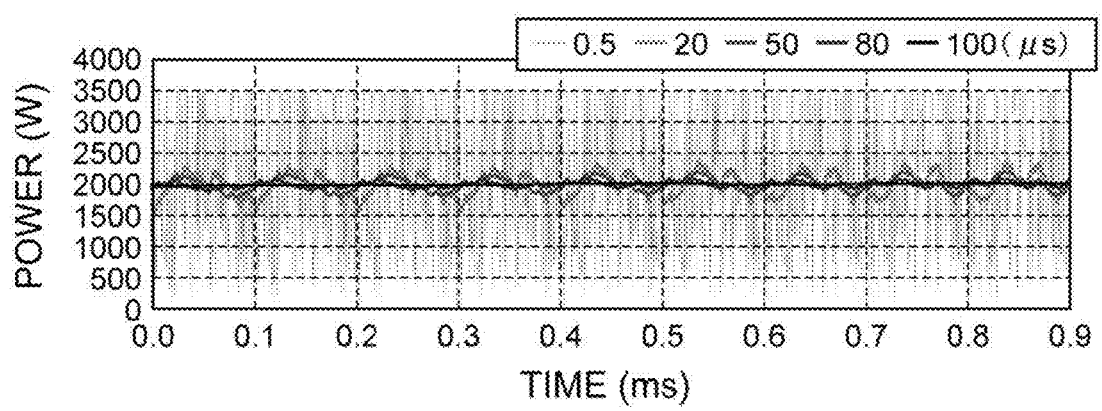
Figure 12:
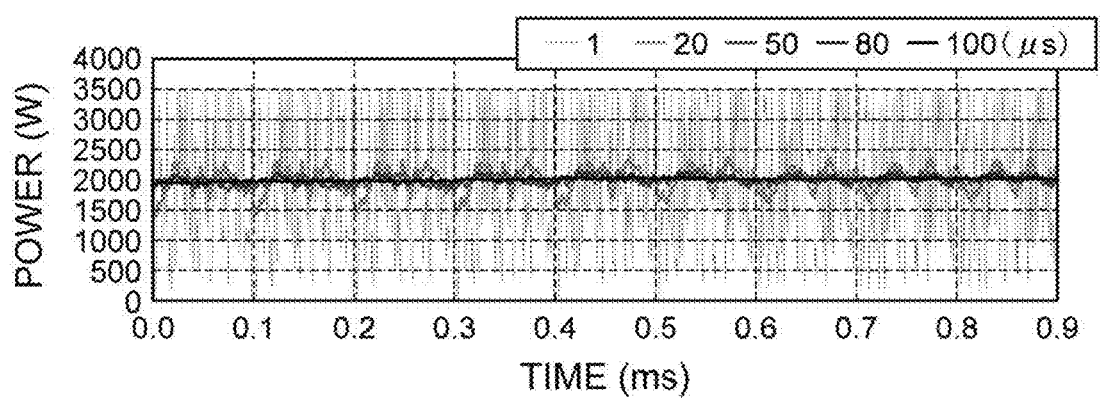
Figure 13:
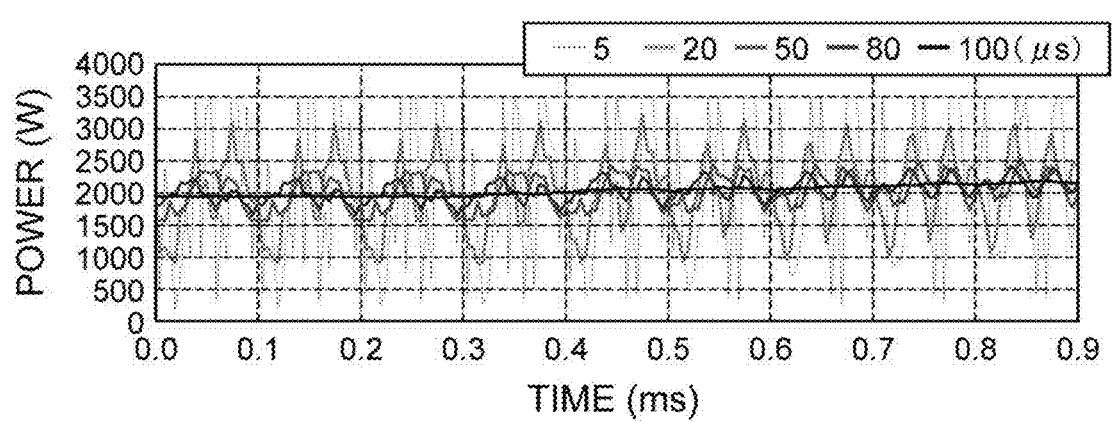
FIG. 13 is a graph indicating a relationship between power of a travelling wave of a microwave and time.
Figure 13:
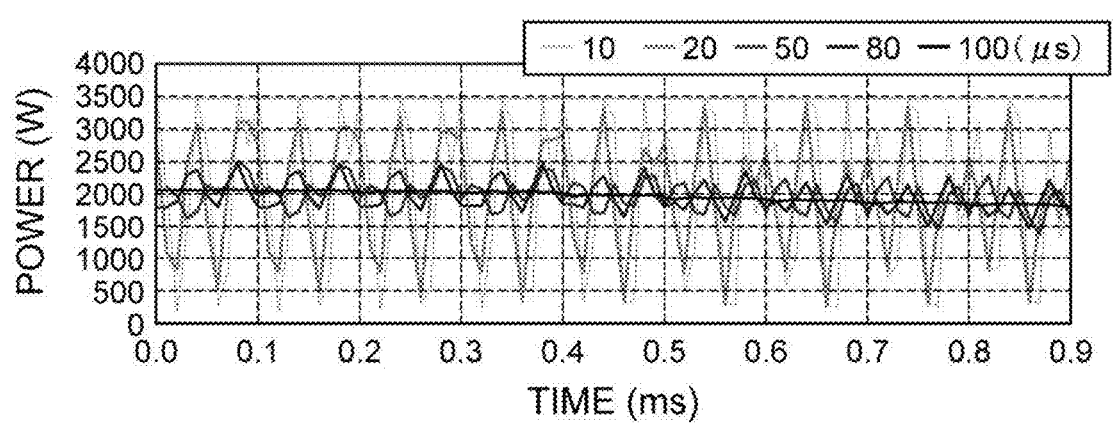

FIGS. 12 and 13 are graphs illustrating a relationship between power of a travelling wave of a microwave and time. A longitudinal axis of the graph expresses power of a travelling wave of a microwave, and a transverse axis expresses time. (A) of FIG. 12 is a graph in a case where the sampling interval is 0.1 µs, and the movement average time is 0.1 µs, 20 µs, 50 µs, 80 µs, and 100 µs. (B) of FIG. 12 is a graph in a case where the sampling interval is 0.5 µs, and the movement average time is 0.5 µs, 20 µs, 50 µs, 80 µs, and 100 µs. (C) of FIG. 12 is a graph in a case where the sampling interval is 1.0 µs, and the movement average time is 1 µs, 20 µs, 50 µs, 80 µs, and 100 µs. (D) of FIG. 13 is a graph in a case where the sampling interval is 5 µs, and the movement average time is 5 µs, 20 µs, 50 µs, 80 µs, and 100 µs. (E) of FIG. 13 is a graph in a case where the sampling interval is 10 µs, and the movement average time is 10 µs, 20 µs, 50 µs, 80 µs, and 100 µs.

As illustrated in FIGS. 12 and 13, it is confirmed that a variation in a waveform is reduced regardless of a sampling time as a movement average time is increased.

Figure 14:
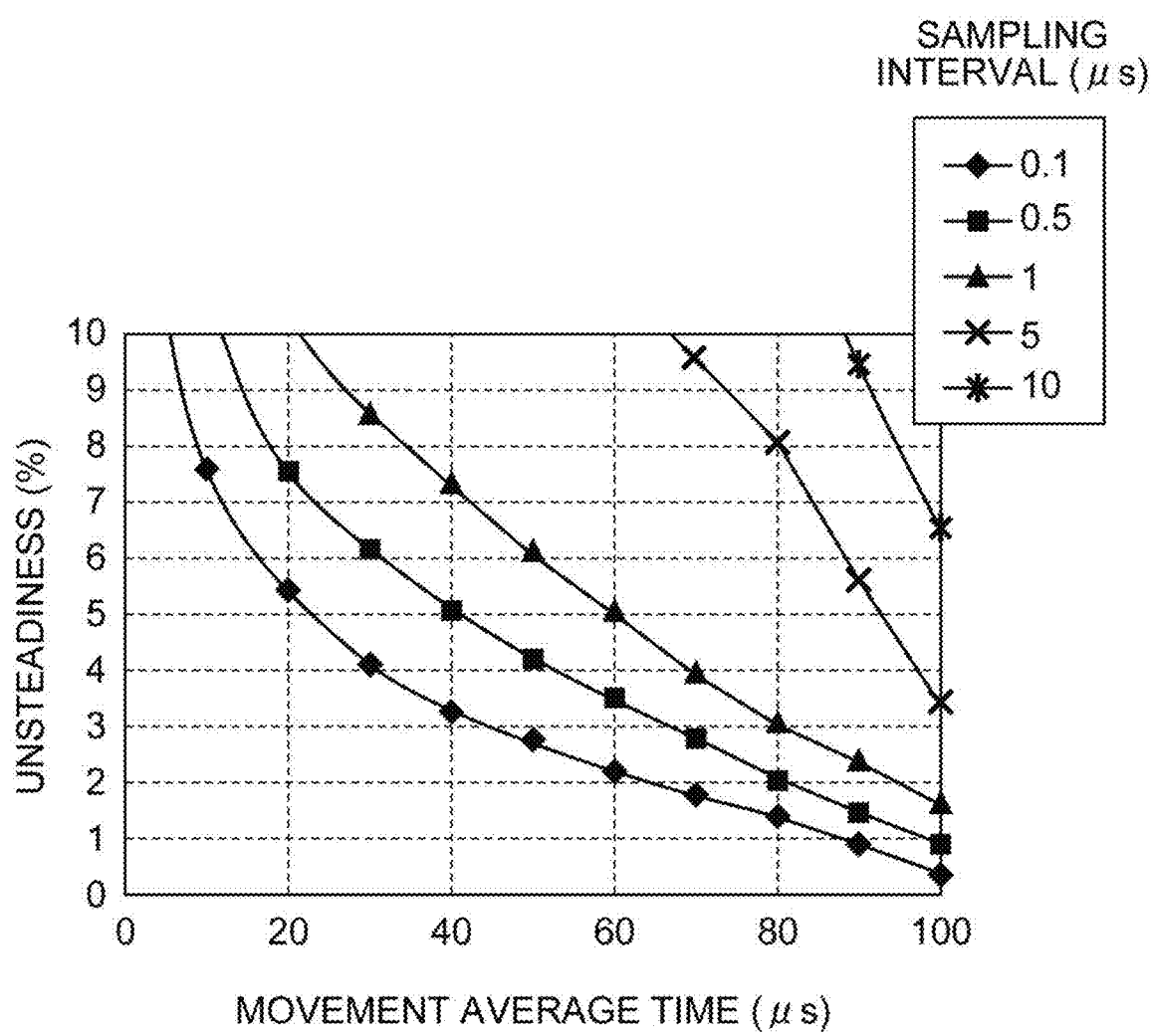
FIG. 14 is a graph illustrating a relationship between a movement average time and unsteadiness of power.

FIG. 14 is a graph illustrating a relationship between a movement average time and unsteadiness of power. Source data for FIG. 14 is the waveform data illustrated in FIGS. 12 and 13. In FIG. 14, a transverse axis expresses a movement average time, and a longitudinal axis expresses unsteadiness. The unsteadiness is defined by a value obtained by dividing a standard deviation by an average value. FIG. 14 is a graph illustrating a relationship between a movement average time and unsteadiness of power for each sampling interval.

As illustrated in FIG. 14, as a movement average time is increased, a variation in a waveform tends to be reduced regardless of a sampling interval. On the other hand, in order to stabilize plasma, the unsteadiness of power is required to be reduced to 3% or less. In other words, plasma can be stabilized when a sampling interval and a movement average time satisfy a predetermined relationship.

Figure 15:
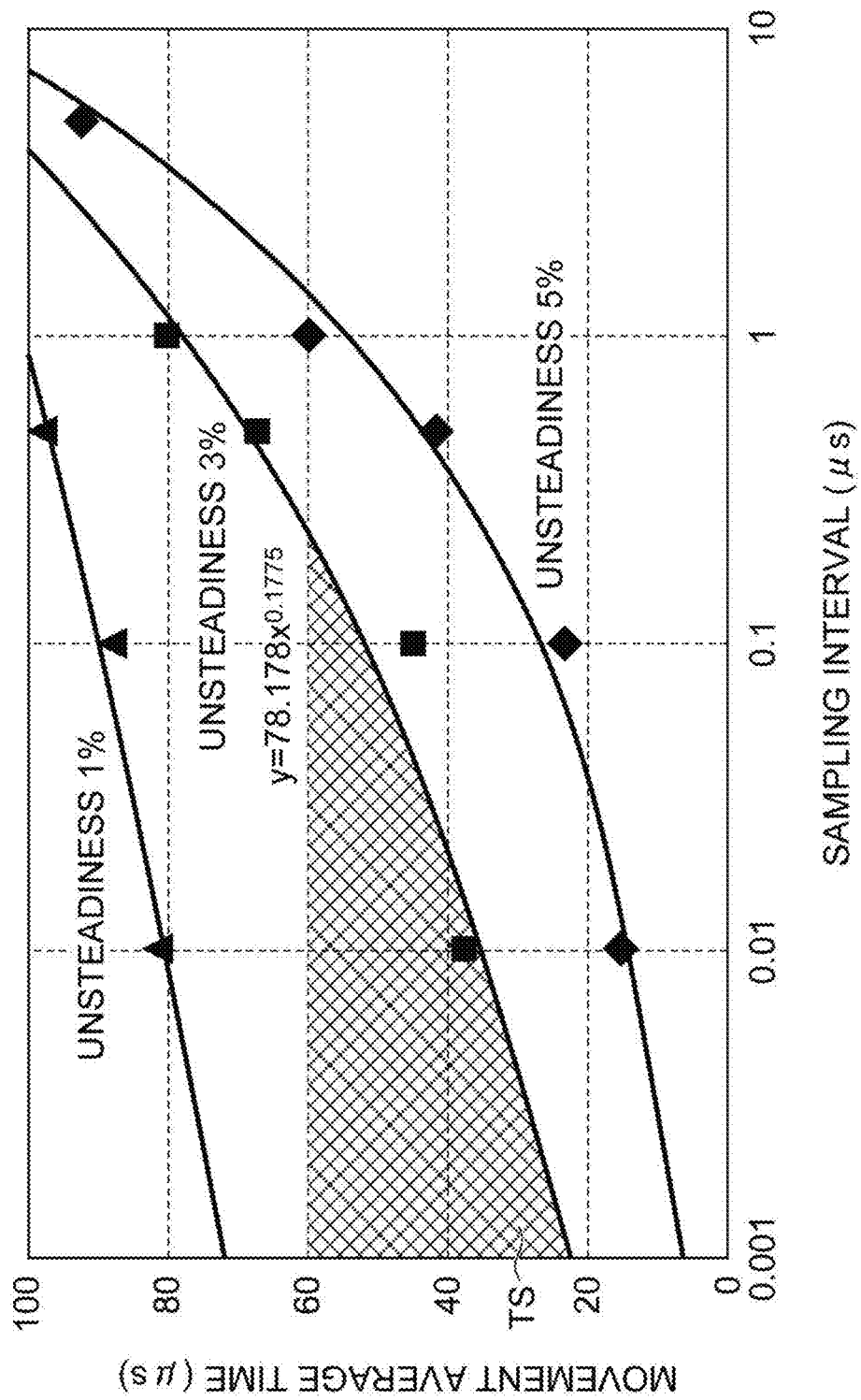
FIG. 15 is a graph illustrating a relationship between a sampling interval and a movement average time.

FIG. 15 is a graph illustrating a relationship between a sampling interval and a movement average time. Source data for FIG. 15 is the data illustrated in FIG. 14. In FIG. 15, a transverse axis expresses a movement average time, and a longitudinal axis expresses unsteadiness. Each piece of data is approximated by an approximate curve. For example, data of unsteadiness of 3% is approximated by $y=78.178x^{0.1775}$ which is an approximate curve. Here, power of which unsteadiness is equal to or less than 3% is data obtained in a range of $y \geq 78.178x^{0.1775}$ when the sampling interval is indicated by x, and the movement average time is indicated by y. A control operation starting time in the PL mode requires 60 and thus the movement average time is 60 μs or less. In other words, it is confirmed that plasma is stabilized when a sampling interval and a movement average time satisfy the relationship of $y \geq 78.178x^{0.1775}$ at the movement average time of 60 μs or less (a region TS in FIG. 15).

[Simulation Results]

Figure 16:
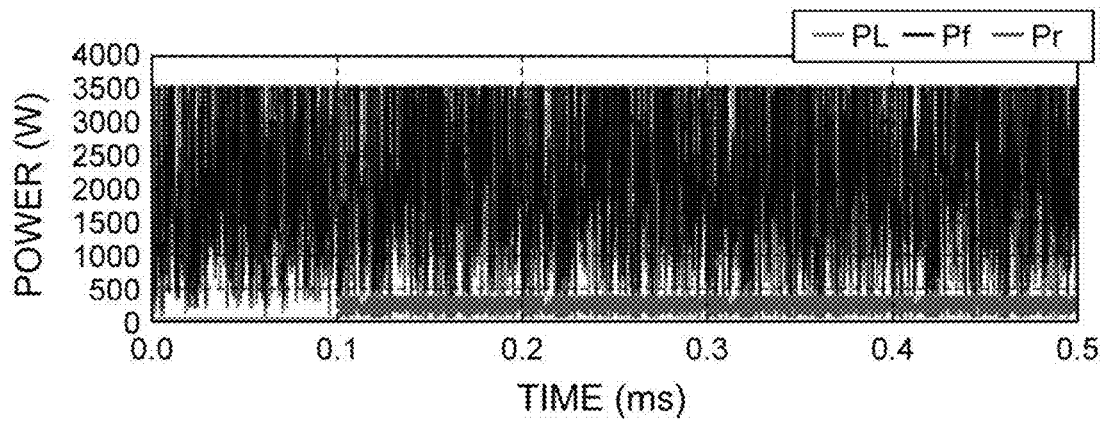
FIG. 16 is a graph illustrating a simulation result of power of a microwave.
Figure 16:
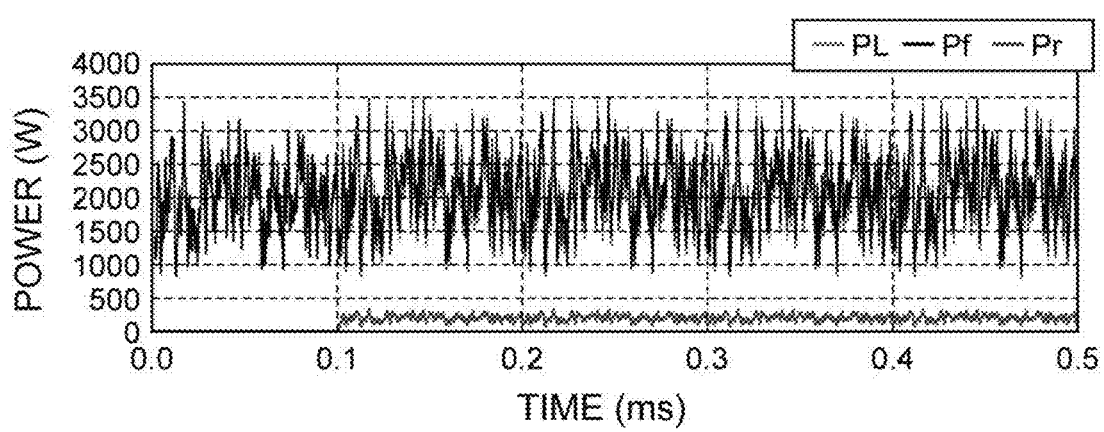
Figure 16:
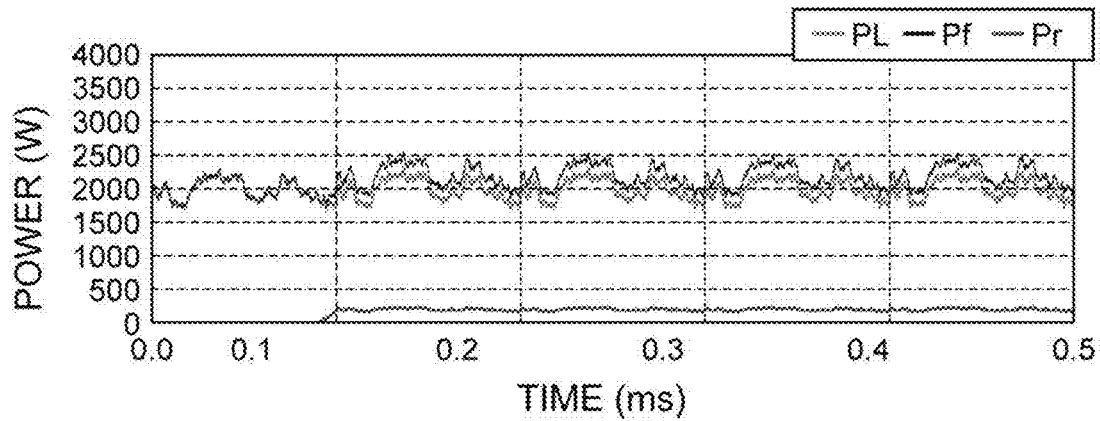
Figure 17:
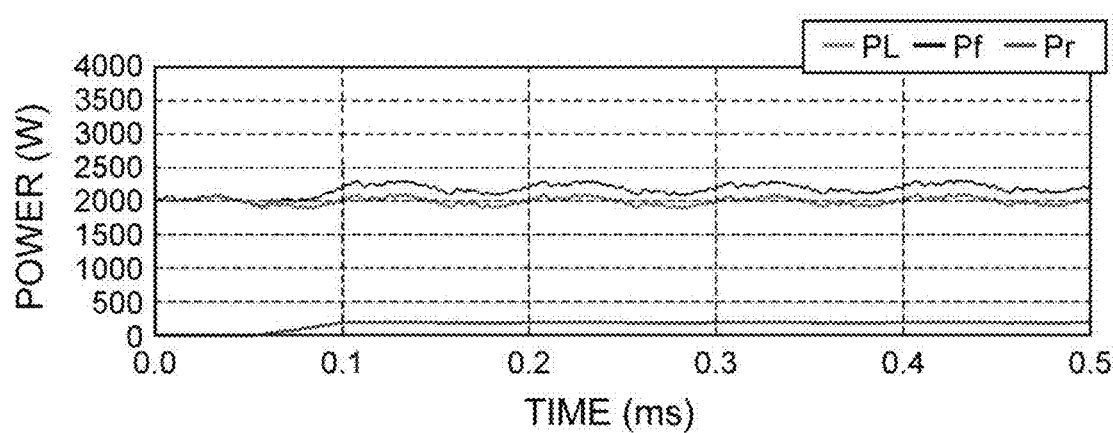
FIG. 17 is a graph illustrating a simulation result of power of a microwave.
Figure 17:
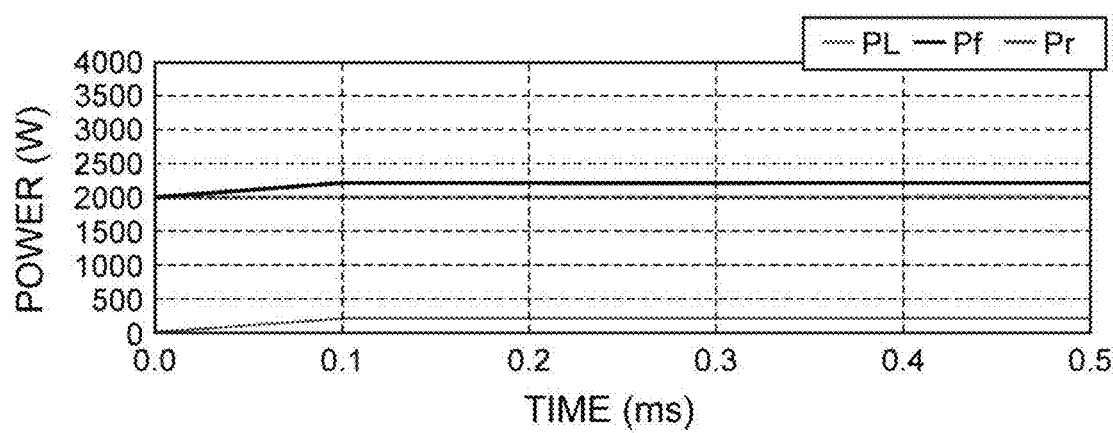

FIGS. 16 and 17 are graphs illustrating simulation results of power of a microwave. A longitudinal axis of the graph expresses power of a microwave, and a transverse axis expresses time. The graph illustrates a behavior of a power waveform when a sampling time is set to 0.1 μs, and a movement average time is increased.

In the simulation, setting power was 2000 W, and a value obtained by subtracting the power Pr of a reflected wave from the power Pf of a travelling wave was set as the load power PL (present value PM). The reflected wave power Pr was set to Pr=Pf/1000 at t<0.05 (where t is time). The reflected wave power Pr was set to Pr=Pf/10 at t≥0.05 (where t is time). A sampling time and a movement average time were changed under the conditions, and the load power PL, the travelling wave power Pf, and the reflected wave power Pr were calculated.

(A) of FIG. 16 illustrates waveforms of the load power PL, the travelling wave power Pf, and the reflected wave power Pr when the sampling interval is 0.1 μs, the movement average time is 0.1 μs, and the number of samples is 1. (B) of FIG. 16 illustrates waveforms of the load power PL, the travelling wave power Pf, and the reflected wave power Pr when the sampling interval is 0.1 μs, the movement average time is 1 μs, and the number of samples is 10. (C) of FIG. 16 illustrates waveforms of the load power PL, the travelling wave power Pf, and the reflected wave power Pr when the sampling interval is 0.1 μs, the movement average time is 10 μs, and the number of samples is 100. (D) of FIG. 17 illustrates waveforms of the load power PL, the travelling wave power Pf, and the reflected wave power Pr when the sampling interval is 0.1 μs, the movement average time is 50 μs, and the number of samples is 500. (E) of FIG. 17 illustrates waveforms of the load power PL, the travelling wave power Pf, and the reflected wave power Pr when the sampling interval is 0.1 μs, the movement average time is 100 μs, and the number of samples is 1000.

The unsteadiness (a value obtained by dividing a standard deviation by an average value) was calculated in each condition. The unsteadiness in (A) of FIG. 16 was 56.2%, the unsteadiness in (B) of FIG. 16 was 24.7%, the unsteadiness in (C) of FIG. 16 was 7.5%, the unsteadiness in (D) of FIG. 17 was 2.7%, and the unsteadiness in (E) of FIG. 17 was 0.4%. Thus, it was confirmed that the unsteadiness is reduced to 3% or less under the conditions in (D) and (E) of FIG. 17. It was confirmed that the condition in (D) of FIG. 17 satisfies the relationship of $y \geq 78.178x^{0.1775}$ at the movement average time of 60 μs or less.

[Advantageous Effects of Embodiment]

As mentioned above, the microwave output device 16 according to the embodiment controls a microwave such that a value obtained by subtracting the second measured values from the first measured values while generating the microwave having a bandwidth comes close to setting power. In other words, load control is performed on the microwave having a bandwidth. In this case, the microwave generation unit 16a averages the first measured values and the second measured values at a predetermined movement average time and a predetermined sampling interval. In an averaging process, the predetermined movement average time is 60 μs or less. In the averaging process, a predetermined sampling interval x and a predetermined movement average time y satisfy a relationship of $y \geq 78.178x^{0.1775}$. A microwave is controlled such that a value obtained by subtracting the averaged second measured value from the averaged first measured value comes close to the setting power. The load control is performed under a condition in which a movement average time is 60 μs or less, and the relationship of $y \geq 78.178x^{0.1775}$ is satisfied, and thus it is possible to stably perform the load control on a microwave having a bandwidth.

In the microwave output device 16 according to the embodiment, a plurality of first correction coefficients are prepared in advance such that one or more first correction coefficients for reducing the error depending on a setting frequency, setting power, and a setting bandwidth are selectable. In the microwave output device 16, one or more first correction coefficients correlated with a setting frequency, setting power, and a setting bandwidth for which instructions are given from the controller 100 are selected from among the plurality of first correction coefficients, and the one or more first correction coefficients are multiplied by a digital value generated by the first A/D converter, and thus the first measured value is obtained. Therefore, an error between power of a travelling wave in the output portion lot and the first measured value obtained on the basis of parts of travelling waves output from the first directional coupler 16f is reduced.

In the microwave output device 16 according to the embodiment, a plurality of second correction coefficients are prepared in advance such that one or more second correction coefficients for reducing the error depending on a setting frequency, setting power, and a setting bandwidth are selectable. In the microwave output device, one or more second correction coefficients correlated with a setting frequency, setting power, and a setting bandwidth for which instructions are given from the controller 100 are selected from among the plurality of second correction coefficients, and the one or more second correction coefficients are multiplied by a digital value generated by the second A/D converter, and thus the second measured value is obtained. Therefore, an error between power of a reflected wave in the output portion 16t and the second measured value obtained on the basis of parts of reflected waves output from the second directional coupler 16h is reduced.

In the microwave output device 16 according to the embodiment, the microwave generation unit 16a can switch a control mode and can thus switch whether or not to perform load control according to a process condition.

As mentioned above, various embodiments have been described, but various modifications may occur without limitation to the embodiments.

REFERENCE SIGNS LIST

1 PLASMA PROCESSING DEVICE, 12 CHAMBER MAIN BODY, 14 STAGE, 16 MICROWAVE OUTPUT

DEVICE, 16a MICROWAVE GENERATION UNIT, 16f FIRST DIRECTIONAL COUPLER, 16g FIRST MEASUREMENT UNIT (EXAMPLE OF MEASUREMENT UNIT), 16h SECOND DIRECTIONAL COUPLER, 16i SECOND MEASUREMENT UNIT (EXAMPLE OF MEASUREMENT UNIT), 16k MEASUREMENT UNIT (EXAMPLE OF MEASUREMENT UNIT), 16t OUTPUT PORTION, 18 ANTENNA, 20 DIELECTRIC WINDOW, 26 TUNER, 27 MODE CONVERTER, 28 COAXIAL WAVEGUIDE, 30 SLOT PLATE, 32 DIELECTRIC PLATE, 34 COOLING JACKET, 38 GAS SUPPLY SYSTEM, 58 RADIO FREQUENCY POWER SUPPLY, 60 MATCHING UNIT, 100 CONTROLLER, 161 WAVEFORM GENERATION UNIT, 162 POWER CONTROL UNIT, 163 ATTENUATOR, 164 AMPLIFIER, 165 AMPLIFIER, 166 MODE CONVERTER, 200 FIRST WAVE DETECTION UNIT, 202 DIODE, 203 CAPACITOR, 205 FIRST A/D CONVERTER, 206 FIRST PROCESSING UNIT, 207 STORAGE DEVICE, 210 SECOND WAVE DETECTION UNIT, 212 DIODE, 213 CAPACITOR, 215 SECOND A/D CONVERTER, 216 SECOND PROCESSING UNIT, 217 STORAGE DEVICE.

The invention claimed is:

1. A microwave output device comprising:
   a microwave generation unit configured to generate a microwave having a center frequency, power, and a bandwidth respectively corresponding to a setting frequency, setting power, and a setting bandwidth for which instructions are given from a controller;
   an output portion configured to output the microwave propagating from the microwave generation unit;
   a first directional coupler configured to output parts of travelling waves propagating toward the output portion from the microwave generation unit;
   a second directional coupler configured to output parts of reflected waves returning to the output portion; and
   a measurement unit configured to determine first measured values indicating power levels of the travelling waves in the output portion on the basis of the parts of the travelling waves output from the first directional coupler, and determine second measured values indicating power levels of the reflected waves in the output portion on the basis of the parts of the reflected waves output from the second directional coupler,
   wherein the microwave generation unit averages the first measured values and the second measured values at a predetermined movement average time and a predetermined sampling interval, and controls the microwave such that a value obtained by subtracting the averaged second measured value from the averaged first measured value comes close to the setting power, and
   wherein the predetermined movement average time is 60 µs or less, and a relationship of $y \geq 78.178x^{0.1775}$ is satisfied when the predetermined sampling interval is indicated by x, and the predetermined movement average time is indicated by y.

2. The microwave output device according to claim 1, wherein the measurement unit includes
   a first wave detection unit configured to generate an analog signal corresponding to power levels of the parts of the travelling waves by using diode wave detection;
   a first A/D converter configured to convert the analog signal generated by the first wave detection unit into a digital value; and
   a first processing unit configured to select one or more first correction coefficients correlated with the setting frequency, the setting power, and the setting bandwidth for which instructions are given from the controller from among a plurality of first correction coefficients set in advance to correct the digital value generated by the first A/D converter to power of a travelling wave in the output portion, and determine the first measured values by multiplying the selected one or more first correction coefficients by the digital value generated by the first A/D converter.

3. The microwave output device according to claim 2, wherein the measurement unit includes
   a second wave detection unit configured to generate an analog signal corresponding to power levels of the parts of the reflected waves by using diode wave detection;
   a second A/D converter configured to convert the analog signal generated by the second wave detection unit into a digital value; and
   a second processing unit configured to select one or more second correction coefficients correlated with the setting frequency, the setting power, and the setting bandwidth for which instructions are given from the controller from among a plurality of second correction coefficients set in advance to correct the digital value generated by the second A/D converter to power of a reflected wave in the output portion, and determine the second measured values by multiplying the selected one or more second correction coefficients by the digital value generated by the second A/D converter.

4. The microwave output device according to claim 3, wherein the microwave generation unit
   controls the microwave such that the value obtained by subtracting the averaged second measured value from the averaged first measured value comes close to the setting power when a control mode for which an instruction is given from the controller is a first control mode, and
   controls the microwave such that the averaged first measured value comes close to the setting power when a control mode for which an instruction is given from the controller is a second control mode.

5. The microwave output device according to claim 2, wherein the microwave generation unit
   controls the microwave such that the value obtained by subtracting the averaged second measured value from the averaged first measured value comes close to the setting power when a control mode for which an instruction is given from the controller is a first control mode, and
   controls the microwave such that the averaged first measured value comes close to the setting power when a control mode for which an instruction is given from the controller is a second control mode.

6. The microwave output device according to claim 1, wherein the measurement unit includes
   a second wave detection unit configured to generate an analog signal corresponding to power levels of the parts of the reflected waves by using diode wave detection;
   a second A/D converter configured to convert the analog signal generated by the second wave detection unit into a digital value; and
   a second processing unit configured to select one or more second correction coefficients correlated with the setting frequency, the setting power, and the setting bandwidth for which instructions are given from the controller from among a plurality of second correction coefficients set in advance to correct the digital value generated by the second A/D converter to power of a reflected wave in the output portion, and determine the second measured values by multiplying the selected one or more second correction coefficients by the digital value generated by the second A/D converter.

7. The microwave output device according to claim 6, wherein the microwave generation unit
controls the microwave such that the value obtained by subtracting the averaged second measured value from the averaged first measured value comes close to the setting power when a control mode for which an instruction is given from the controller is a first control mode, and
controls the microwave such that the averaged first measured value comes close to the setting power when a control mode for which an instruction is given from the controller is a second control mode.

8. The microwave output device according to claim 1, wherein the microwave generation unit
controls the microwave such that the value obtained by subtracting the averaged second measured value from the averaged first measured value comes close to the setting power when a control mode for which an instruction is given from the controller is a first control mode, and
controls the microwave such that the averaged first measured value comes close to the setting power when a control mode for which an instruction is given from the controller is a second control mode.

9. A plasma processing device comprising:
a chamber main body; and
a microwave output device that outputs a microwave for exciting a gas to be supplied to the chamber main body, the microwave output device comprising:
a microwave generation unit configured to generate a microwave having a center frequency, power, and a bandwidth respectively corresponding to a setting frequency, setting power, and a setting bandwidth for which instructions are given from a controller;
an output portion configured to output the microwave propagating from the microwave generation unit;
a first directional coupler configured to output parts of travelling waves propagating toward the output portion from the microwave generation unit;
a second directional coupler configured to output parts of reflected waves returning to the output portion; and
a measurement unit configured to determine first measured values indicating power levels of the travelling waves in the output portion on the basis of the parts of the travelling waves output from the first directional coupler, and determine second measured values indicating power levels of the reflected waves in the output portion on the basis of the parts of the reflected waves output from the second directional coupler,
wherein the microwave generation unit averages the first measured values and the second measured values at a predetermined movement average time and a predetermined sampling interval, and controls the microwave such that a value obtained by subtracting the averaged second measured value from the averaged first measured value comes close to the setting power, and
wherein the predetermined movement average time is 60 µs or less, and a relationship of $y \geq 78.178x^{0.1775}$ is satisfied when the predetermined sampling interval is indicated by x, and the predetermined movement average time is indicated by y.

10. The plasma processing device according to claim 9, wherein the measurement unit includes
a first wave detection unit configured to generate an analog signal corresponding to power levels of the parts of the travelling waves by using diode wave detection;
a first A/D converter configured to convert the analog signal generated by the first wave detection unit into a digital value; and
a first processing unit configured to select one or more first correction coefficients correlated with the setting frequency, the setting power, and the setting bandwidth for which instructions are given from the controller from among a plurality of first correction coefficients set in advance to correct the digital value generated by the first A/D converter to power of a travelling wave in the output portion, and determine the first measured values by multiplying the selected one or more first correction coefficients by the digital value generated by the first A/D converter.

11. The plasma processing device according to claim 9, wherein the measurement unit includes
a second wave detection unit configured to generate an analog signal corresponding to power levels of the parts of the reflected waves by using diode wave detection;
a second A/D converter configured to convert the analog signal generated by the second wave detection unit into a digital value; and
a second processing unit configured to select one or more second correction coefficients correlated with the setting frequency, the setting power, and the setting bandwidth for which instructions are given from the controller from among a plurality of second correction coefficients set in advance to correct the digital value generated by the second A/D converter to power of a reflected wave in the output portion, and determine the second measured values by multiplying the selected one or more second correction coefficients by the digital value generated by the second A/D converter.

12. A plasma processing device according to claim 9, wherein the microwave generation unit
controls the microwave such that the value obtained by subtracting the averaged second measured value from the averaged first measured value comes close to the setting power when a control mode for which an instruction is given from the controller is a first control mode, and
controls the microwave such that the averaged first measured value comes close to the setting power when a control mode for which an instruction is given from the controller is a second control mode.

* * * * *